(12) United States Patent
Miyamoto et al.

(10) Patent No.: US 7,164,738 B2
(45) Date of Patent: Jan. 16, 2007

(54) SIGNAL CANCELING METHOD AND DEVICE

(75) Inventors: Hiromi Miyamoto, Nishinasuno (JP); Yoshiaki Nakano, Kuroiso (JP); Ichiro Abeno, Nishinasuno (JP)

(73) Assignee: Fujitsu Limited, Kawasaki (JP)

( * ) Notice: Subject to any disclaimer, the term of this patent is extended or adjusted under 35 U.S.C. 154(b) by 910 days.

(21) Appl. No.: 09/725,532

(22) Filed: Nov. 29, 2000

(65) Prior Publication Data

US 2001/0002207 A1     May 31, 2001

(30) Foreign Application Priority Data

Nov. 30, 1999     (JP)     ............... H11-341285

(51) Int. Cl.
*H04B 15/00*     (2006.01)
(52) U.S. Cl. .................... 375/346; 375/296; 375/322; 375/343; 455/63.1
(58) Field of Classification Search ............... 375/346, 375/296, 297, 322, 343; 330/52, 84, 149, 330/151; 333/33; 455/138, 273, 296, 63.1; 365/194, 196, 226–229; 327/317
See application file for complete search history.

(56) References Cited

U.S. PATENT DOCUMENTS

| | | | | |
|---|---|---|---|---|
| 4,109,212 A | * | 8/1978 | Donnell et al. ............. | 327/317 |
| 4,584,712 A | * | 4/1986 | Isobe et al. ................. | 455/273 |
| 5,046,133 A | * | 9/1991 | Watanabe et al. ........... | 455/138 |
| 5,880,633 A | * | 3/1999 | Leizerovich et al. .......... | 330/84 |
| 6,046,635 A | * | 4/2000 | Gentzler .................... | 330/149 |
| 6,160,996 A | * | 12/2000 | Blodgett et al. ........... | 455/63.1 |

FOREIGN PATENT DOCUMENTS

| JP | 62-141824 | 6/1987 |
|---|---|---|
| JP | 10-200340 | 7/1998 |

\* cited by examiner

*Primary Examiner*—Jean B. Corrielus
*Assistant Examiner*—Edith Chang
(74) *Attorney, Agent, or Firm*—Katten Muchin Roseman LLP

(57) ABSTRACT

In a signal cancellation method and device which can cancel input signals quickly and reliably (stably), an input signal is split into a first and second signal. The second signal is split into mutually orthogonal first and second subsignals which are recombined after the respective amplitudes thereof have been adjusted, The first signal is canceled by the third signal thereby obtained. The orthogonal subsignals can undergo amplitude adjustment independently, and the third signal obtained by recombining the subsignals after adjustment can become a cancellation signal having a really selected phase and amplitude over the first through fourth quadrants of the vector plane.

5 Claims, 20 Drawing Sheets

INITIAL STATUS

B0 AMPLITUDE CONTROL

B90 AMPLITUDE CONTROL

INITIAL STATUS

B0 AMPLITUDE CONTROL

B90 AMPLITUDE CONTROL

B90 AMPLITUDE CONTROL

B0 AMPLITUDE CONTROL

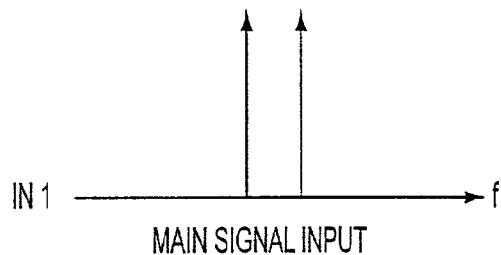
FIG. 12A  MAIN SIGNAL INPUT
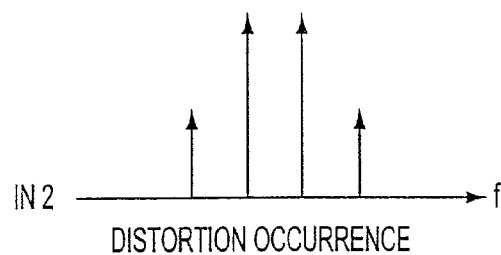
FIG. 12B  DISTORTION OCCURRENCE
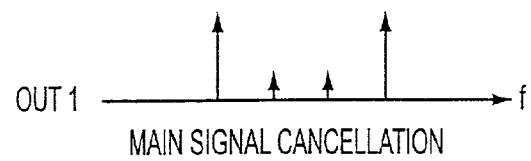
FIG. 12C  MAIN SIGNAL CANCELLATION
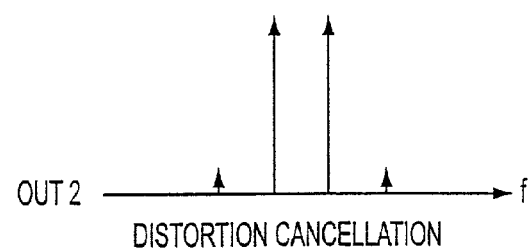
FIG. 12D  DISTORTION CANCELLATION

90° SPLITTER-COMBINER

IN-PHASE SPLITTER-COMBINER

IN-PHASE SPLITTER-COMBINER

180° SPLITTER-COMBINER

IN-PHASE SPLITTER-COMBINER

CIRCULATOR TYPE

MIXER TYPE

GAIN CONTROL TYPE

HYBRID TYPE

INITIAL STATUS

AMPLITUDE CONTROL

PHASE CONTROL

PHASE CONTROL

AMPLITUDE CONTROL

AMPLITUDE CONTROL

SIGNAL CANCELING METHOD AND DEVICE

BACKGROUND OF THE INVENTION

1. Field of the Invention

The present invention relates to a signal cancellation method and a signal cancellation device. More specifically, a method and device for signal cancellation wherein a portion of an input signal is split, the phase and amplitude components thereof are adjusted so as to have the opposite phase as a split signal, and wherein by recombining these, the input signal is cancelled.

A signal cancellation device (circuit) is presently widely used in signal cancellation loops which are used in such equipment as self-adjusting feed-forward amplifiers. Specifically, in a feed-forward amplifier, by combining a distortion extraction loop, which amplifies an input signal and cancels the input signal component from said signal, and a distortion cancellation loop, which cancels the distortion signal component generated by the amplifier, an amplified signal in which the distortion component is suppressed can be ultimately obtained.

2. Description of the Prior Art

FIG. 15 is a block diagram of a conventional input signal cancellation loop. In the figure, the input signal cancellation loop of FIG. 15 includes a conventional cancellation loop circuit 10, a splitter 11, which splits a given of the input IN into 2 signals A and B (where the ratio is optional), a delay line 12, which delays signal A by the same time as the processing system for signal B, a cancellation adjuster 60, which adjusts the phase and amplitude of the signal B, a phase adjuster 61 and an amplitude adjuster 62 (attenuator, etc.) thereof, an amplifier 14, which amplifies signal B after the aforesaid phase adjustment, and a combiner 13, which combines the delayed signal A' of the delay line 12 and the cancellation signal B' after amplification.

Furthermore, the input signal cancellation loop of FIG. 15 has an automatic controller 50, which monitors the combined signal C of the output OUT and performs automatic control of the cancellation adjuster 60 so that the amplitude of said signal C is within a specified level (≈0), a wave detector 52, which performs wave detection on the amplitude of the composite signal (extracted signal) C of the output, an A/D converter (A/D) 53, which performs A/D conversion on the wave detection output, a CPU 54, which incorporates a control program for cancellation adjustment, which is described hereinunder, D/A converters (D/A) 55, 56, which performs D/A conversion on the amplitude control signal CA and phase control signal CP, respectively, and a common bus 57 of the CPU 54.

To summarize the operation, a given signal of the input IN is split into the 2 signals A and B by the splitter 11, one signal A is delayed by the delay line 12 to become a delay signal A'. The other signal B is adjusted in phase and amplitude by the cancellation adjuster 60, then amplified by the amplifier 14, and becomes cancellation signal B' for canceling the delay signal A'. Additionally, the 2 signals of A' and B' are combined by a combiner 13, and become the composite signal C of the output OUT.

Meanwhile, in this state the automatic controller 50, along with monitoring the amplitude of the composite signal C, alternately controls the phase adjuster 61 and amplitude adjuster 62 in respective time division so that said amplitude becomes 0, and by this means the cancellation signal B' is adjusted to the opposite phase and same amplitude as the delay signal A', thus canceling the input signal. The conventional signal cancellation method is explained in detail below in accordance with a vector diagram.

FIGS. 16 (a) through 16 (f) show a diagram explaining a conventional input signal cancellation method. When the initial status at a certain point in the circuit is represented as (a), the cases where adjustment is performed first from the phase (b) and (c) and cases where adjustment is performed first from the amplitude (d), (e), and (f) are respectively indicated in time sequence. In the initial status of the FIG. 16 (a), signal B can assume various phases and amplitudes with respect to the vector (hereinafter the vector is referred to as a signal) A' that is the object of cancellation, but by adjusting this signal B so that it becomes a cancellation signal B' (having the opposite phase and the same amplitude as signal A'), the input signal can be canceled.

When starting adjustment from the phase, the process advances from the figure (a) to the figure (b). In the FIG. 16 (b), when the phase of the signal B is rotated in the direction of the arrow b, the output signal C when the opposite phase as the signal A' becomes minimal. In the FIG. 16 (c), when the amplitude of the signal B is reduced in the direction of the arrow c, the output signal C when the amplitude is the same as that of the signal A' becomes minimal (C=0). Thus, when starting adjustment from phase, typically, adjustment is completed in the 2 steps of the figures (b) and (c).

On the other hand, when starting adjustment from amplitude, the process advances from the figure (a) to the FIG. 16 (d). In the FIG. 16 (d), when the amplitude of the signal B is reduced in the direction of the arrow d, the output signal C becomes minimal and at the point intersecting the circle r. In other words, the head of the output signal C, which is the composite signal of the 2 signals A' and B, in accordance with a reduction in the amplitude of the signal B, moves downward on the segment L1, which is parallel to the signal B, as indicated by the broken line in the figure, but when the output signal C and segment L1 become orthogonal, the amplitude of the output signal C becomes minimal.

It should be noted that, when the output signal C moves toward the head of signal B' at this time, signal C becomes orthogonal to signal B, and accordingly a right triangle is formed having the signals B', C and B as its sides. The circle r is a circle which has signal B' as a radius and is externally tangential to the right triangle, and accordingly the relation whereby the output signal C is minimized at the point at which the aforesaid reduction (or increase) in signal B and the circle r intersect is always established so long as signal B and the circle r intersect.

In the FIG. 16 (e), when the phase of the signal B is turned in the direction of the arrow e, the output signal C when in the opposite phase as the signal A' becomes minimal. In the FIG. 16 (f), when the amplitude of the signal B is increased in the direction of the arrow f, the output signal C when the same amplitude as signal A' becomes minimal (C=0). Thus, when starting adjustment from amplitude, typically, adjustment is completed in the 3 steps of the figures (d)~(f).

FIGS. 17 A and 17 B show a diagram explaining the range of control by a conventional system, wherein FIG. 17 (A) shows the range of control by vector expression. In FIG. 17 (A), by combining signal B with signal A', which is the object of cancellation, the composite signal C of the output is formed, and the purpose of control is to make this composite signal C=0.

The physically changeable range of the phase and amplitude are determined by the circuit configurations (settings) of the respective phase adjuster 61 and amplitude adjuster 62. Here, the interior of the region W1, which satisfies both, becomes the physically controllable range. It should be noted that the circle r, as explained in the aforesaid FIG. 16 (d), is composed of the aggregation of points at which the composite signal C becomes minimal in the control of amplitude of signal B, and the amplitude control of the signal B must intersect with the circle r until the signal B reaches its minimal value within the physically controllable range (indicated by the circle R2). Accordingly, the actual (practical) control range becomes the region W2, which is narrower than the physical control range W1.

FIG. 17 (B) represents the control range of FIG. 17 (A) in the form of a graph (orthogonal plane), and the physical control region W1 and practical control region W2 are respectively shown in correspondence with FIG. 17 (A). As explained in reference of FIGS. 16 (b) and 16 (c), when starting from phase adjustment, by means of the phase control shown in FIG. 16 (b), the phase differential between the signals A' and B can be adjusted to 180 degrees (indicated in the figure by the arrow p), so that, in the amplitude control shown in the following FIG. 16 (c), the signal A' is effectively canceled.

However, as explained in reference of FIGS. 16 (d)~(f), when beginning from amplitude adjustment, if signal B happens to be in the region W2 (indicated by the arrow a in the figure) the minimal value of the composite signal C can be detected in amplitude control, and accordingly the next phase control can be performed normally, but if it is between W1 and W2, before the minimal value of the composite signal C can be detected, the physical control range R2 of the amplitude adjuster 62 is exceeded, and the minimal value of the composite signal C can no longer be detected. Thus, an obstacle to the control algorithm for automatic control, which is described below, is created.

In this connection, it is possible to set the physical control range R2 of the amplitude adjuster 62 so as to be smaller. By this means, as shown in the aforesaid FIG. 16 (d), even if the signal B is in the phase Bi, it is still possible barely to detect the minimal point of the composite signal C. The detection of this minimal point, in terms of FIG. 17 (B), corresponds to detection in the arrow b.

However, if signal B after amplitude adjustment thereby becomes too small, in the phase adjustment in the following FIG. 16 (e), the change in the composite signal C will be sluggish (small), even if the phase of the small signal B is rotated, thus creating impediments to the detection control and detection precision of the minimal point phase in the automatic controller 50. Moreover, in the amplitude control of the following FIG. 16 (e), it is necessary to return the amplitude of the signal B to a larger size, and while this type of hunting adjustment is performed as described above, a composite signal C having a large amplitude will be output to the output OUT.

To give an extreme example, if the amplitude adjuster 62 provided is that so that the physical control range can be up to R2=0, in FIG. 16 (d), for example, even in the initial phase in which the signal B does not intersect with the circle r, although adjustment is possible to a point such that signal B=0, as a result, the minimal point of the composite signal C cannot be found in the phase control of FIG. 16 (e), and accordingly, an obstacle to the control algorithm for automatic control is created.

FIGS. 18 (A) and 18 (B) show a flowchart for the conventional automatic control process. FIG. 18 (A) depicts an example of an automatic control process, where input is made to this process when the circuit power is switched on. In step S11, initial setting of the phase adjuster 61 and amplitude adjuster 62 is performed in accordance with the default parameters. In step S12, it is determined whether the output signal amplitude C>TH (specified threshold value). If C>TH, then the amplitude C of the output signal exceeds the permitted range, so after an alarm signal is output in step S17, the process advances to step S13. If C is not greater than TH, then the process advances directly to step S13.

In step S13, the phase control signal CP is changed slightly in one direction. In step S14, it is determined whether or not the minimal point of the output signal C has been detected, and if the minimal point has not been detected, the sequence returns to step S13. When the output signal C has ceased decreasing and begins to increase during the process of the continued repetition of steps S13 and S14, then the minimal point has been detected, and otherwise, there has been no minimal point detection. In this case, when the output signal C increases after the initial change of the aforesaid phase adjustment signal CP, the direction of the change of the phase adjustment signal CP is reversed.

When in due course there had been minimal point detection according to the discrimination in the aforesaid step S14, in step S15, the amplitude control signal CA is slightly changed in one direction. In step S16, it is determined whether there has been minimal point detection of the output signal C, and if there is no minimal point detection, the sequence returns to step S15. When minimal point detection occurs in due course, the sequence returns to step S12. The processes of the aforesaid steps S12 and S17 may be provided so as to follow the aforesaid step S16.

FIG. 18 (B) shows another example of automatic control processing, where, instead of the above-described minimal point detection of the output signal C, a specified number (such as approximately 1 time to 5 times) of continuous decreases is detected. The same step numbers are used for steps which correspond to those in the process shown in FIG. 18 (A), and the explanation thereof is omitted. In step S18 of this process, it is determined whether a specified number of decreases in the output signal C have been detected, and if there has been no such detection, the sequence returns to step S13. If the output signal C in the repeated series of steps S13 and S18 begins to increase after decreasing, then the process skips step S18 to the Yes side. If the output signal C increases from the initial change in the phase adjustment signal CP, then the direction of change of the phase adjustment signal CP is reversed. Similarly, in step S19, it is determined whether the specified number of decreases in the output signal C has been detected, and if not detected, the sequence returns to step S15. Then, when in due course the specified number of decreases has been detected, the sequence returns to step S12.

As described above, a conventional signal cancellation loop alternately adjusts the phase and amplitude of the cancellation signal B by the phase adjuster 61 and amplitude adjuster 62.

However, when starting from the amplitude adjustment, since the minimal point of the signal B for minimizing the output signal C changes to a greater extent than the phase difference between the two signals A' and B, first, unless the control of amplitude is started from the minimal point of the phase, it takes time to find the optimal point, and, in the worst cases, the control range for amplitude is violated. For this reason, it is necessary to start the cancellation process from phase.

Moreover, even if control is started from phase, in actuality there are many cases where a disturbance (such as fluctuations in phase) occurs at the time of shifting to amplitude control, and when a disturbance occurs in this timing, ultimately the control route described in reference of FIGS. 16 (d)~(f) must be followed, and the automatic control of signal cancellation becomes unstable.

Heretofore, in cases where the signal A' which is the object of cancellation is used as a standard, when the phase P of the signal B falls outside of the range of $-90° \leq P \leq 90°$, since a minimal point does not exist during amplitude control, the practically controllable range has been greatly restricted. Moreover, if the condition of signal B amplitude≈0 were permitted, since the minimal point of the following phase cannot be detected, the automatic control for signal cancellation would become unstable.

SUMMARY OF THE INVENTION

The present invention has been produced in light of the problems in prior art. It is an object of the present invention to provide a signal cancellation method and device which are able to cancel input signals quickly and reliably (stably).

This and other objects of the present invention are attained by a signal cancellation method wherein an input signal is split into a first and second signal, and the second signal is split into mutually orthogonal first and second subsignals, which are recombined after the respective amplitudes thereof have been adjusted, forming a third signal, and the first signal is cancelled by the third signal thereby obtained.

In an embodiment an input signal is split into a first and second signal, the second signal is split into first and second subsignals of the same phase, which are orthogonally recombined after the respective amplitudes thereof have been adjusted, forming a third signal, and the first signal is cancelled by the third signal.

The first and/or second subsignals may be split into third and fourth subsignals of mutually opposite phases, the fourth subsignal may be delayed, and after the amplitude of said third subsignal has been adjusted, it is recombined with the fourth subsignal after said delay.

The first and/or second subsignals may be split into third and fourth subsignals of the same phase, the fourth subsignal may be delayed, and after the amplitude of said third subsignal has been adjusted, it is recombined in antiphase with the fourth subsignal after the delay.

The second signal may be split into mutually orthogonal first and second subsignals and a third subsignal having a freely selected phase in the opposite quadrant as the first and second subsignals, the third subsignal may be delayed, and the amplitudes of the first and second subsignals have been adjusted, they are recombined in antiphase with the third subsignal after the delay.

The second signal may be split into mutually in-phase first, second and third subsignals, the third subsignal may be delayed, the first and second subsignals after amplitude adjustment are then combined in mutually orthogonal phase and the third subsignal after the delay is combined in a freely selected phase in the quadrant opposite the first and second subsignals.

In an embodiment, a first adjustment process, whereby the amplitude of the first subsignal is adjusted and the amplitude of the output signal at this time is minimized or reduced, and a second adjustment process, whereby the amplitude of the second subsignal is adjusted and the amplitude of the output signal at this time is minimized or reduced, are alternately performed in repetition.

The objects of the present invention are also achieved by a signal cancellation device, which adjusts the phase and amplitude components of one signal formed by the splitting of an input signal so as to be the antiphase of the other signal, and cancels the input signal component by recombining these signals. The signal cancellation device includes an orthogonal splitter, which splits one of said signals into first and second subsignals which are mutually orthogonal, first and second amplitude adjusters, which are able to adjust the amplitudes of the first and second subsignals, and an in-phase combiner, which combines in-phase said first and second subsignals which have undergone amplitude adjustment.

In an embodiment, the signal cancellation device includes an in-phase splitter, which splits one of said signals into first and second subsignals having the same phase, first and second amplitude adjusters, which are able to adjust the amplitudes of the first and second subsignals, and an orthogonal combiner, which orthogonally combines said first and second subsignals which have undergone amplitude adjustment.

The first and/or second amplitude adjuster may be able to reverse its output signal in positive phase or reverse phase.

In an embodiment, the first and/or second amplitude adjuster are/is provided with an anti-phase splitter, which splits input subsignals into third and fourth subsignals of opposite phases, a delay device, which delays the fourth subsignal, an amplitude adjuster, which is able to adjust the amplitude of the third subsignal in a single phase, and an in-phase combiner, which combines in the same phase the third subsignal after amplitude adjustment and the fourth subsignal after delay.

In an embodiment, the orthogonal splitter, which splits the split signal into mutually orthogonal first and second subsignals, and the anti-phase splitter, which splits subsignals of the input into third and fourth subsignals having mutually opposite phases, are formed by a common multi-phase splitter.

The first and/or second amplitude adjuster may include an in-phase splitter, which splits input subsignals into third and fourth subsignals of the same phase, a delay device, which delays the fourth subsignal, an amplitude adjuster, which is able to adjust the amplitude of the third subsignal in a single phase, and an anti-phase combiner, which combines in opposite phases the third subsignal after amplitude adjustment and the fourth subsignal after delay.

In one embodiment, the orthogonal combiner, which orthogonally combines the first and second subsignals after amplitude adjustment, and the anti-phase combiner, which combines the third subsignal after amplitude adjustment and the fourth subsignal after delay in opposite phases, are formed by a common multi-phase combiner.

In an embodiment, the first and/or second amplitude adjuster may include a splitter, which splits the input split signals into mutually orthogonal first and second subsignals and a third subsignal, which has a freely selected phase and is in the opposite quadrant of the first and second subsignals, a delay device, which delays said third subsignal, third and fourth amplitude adjusters, which are able to adjust the amplitudes of said first and second subsignals each in a single phase, and an in-phase combiner, which combines in the same phase said first and second subsignals after amplitude adjustment and the third subsignal after delay.

The signal cancellation device of the present invention may also include an automatic controller, which alternately and repetitively performs a first adjustment process, whereby the amplitude of the output signal at this time is minimized or reduced by controlling a first amplitude adjuster, and a second adjustment process, whereby the amplitude of the output signal at this time is minimized or reduced by controlling a second amplitude adjuster, are alternately performed in repetition.

According to the present invention, a feed-forward amplifier is proposed which includes the above signal cancellation device.

Due to the present invention, as described above, by splitting a portion of the input signal, dividing this into a first and second subsignal which are mutually orthogonal, and which are recombined after the adjustment of their respective amplitudes, and using the signal obtained to cancel the split signal, a given input signal can be quickly and reliably canceled, thereby significantly contributing to the improvement of performance and operating stability in instruments such as feed-forward amplifier.

BRIEF DESCRIPTION OF THE DRAWINGS

FIG. 12 is a diagram explaining the operation of a feed-forward amplifier of FIG. 11;

DETAILED DESCRIPTION

FIG. 1 (A) shows the principle of the present invention. Specifically, according to the signal cancellation method of the present invention, an input signal is split into a first and second signal A and B, and said second signal B is split into mutually orthogonal first and second subsignals B0 and B90, which are recombined after the respective amplitudes thereof have been adjusted, and said first signal A' is cancelled by the third signal B' thereby obtained.

The second signal B is split into first and second subsignals B0 and B90, which are recombined after the respective amplitudes have been adjusted, since there is no correlation between the minimal points (or decreases) during amplitude adjustment of the orthogonal subsignals B0 and B90, these can be adjusted mutually independently, and the composite signal B (B') of their output can be controlled to a desired phase and amplitude over the first through fourth quadrants on the vector plane.

Accordingly, by searching the optimal point of signal cancellation by the mutual adjustment of the amplitudes of the subsignals B0 and B90, there is no correlation between these adjustments, and control can be completed typically by as short a process as 2 steps. Moreover, amplitude control can be started from either of the subsignals B0 and B90. Additionally, since there are no restrictions with respect to the starting ranges for the control of the subsignals B0 and B90, the optimal point can be narrowed down within the shortest time no matter what type of initial phase relation exists between the signals A' and B. Further, external amplitude control can be performed from any location or in any timing, so long as the optimal points are contained within the physical control range.

Here, the initial status at a certain point in time is shown in FIG. 1 (B), and a vector diagram in the case where amplitude control of the subsignal B0 is performed is shown in FIG. 1 (C), while that in the case where amplitude control of the subsignal B90 is performed is shown in FIG. 1 (D). Moreover, although not shown in the figures, this amplitude control is completed in 2 steps even when started from the subsignal B90.

Figure 1A:
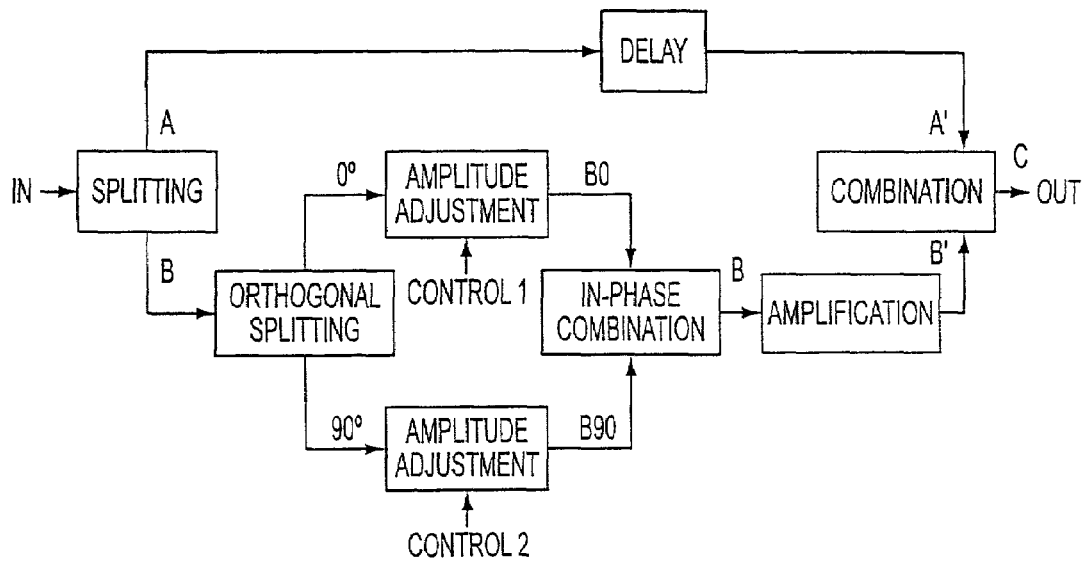
FIG. 1 (A) through 1(D) diagrammatically show the principle of the present invention.
Figure 1B:
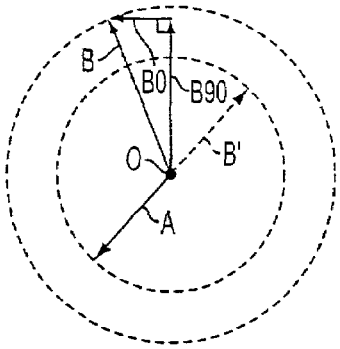
Figure 1C:
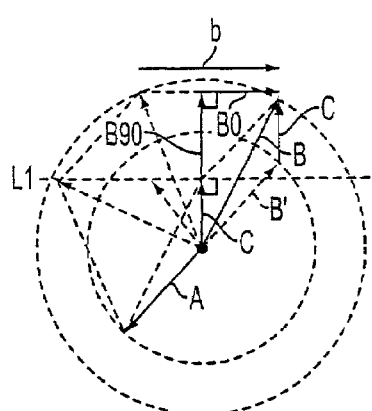
Figure 1D:
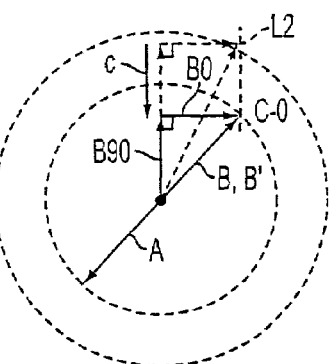
Figure 2:
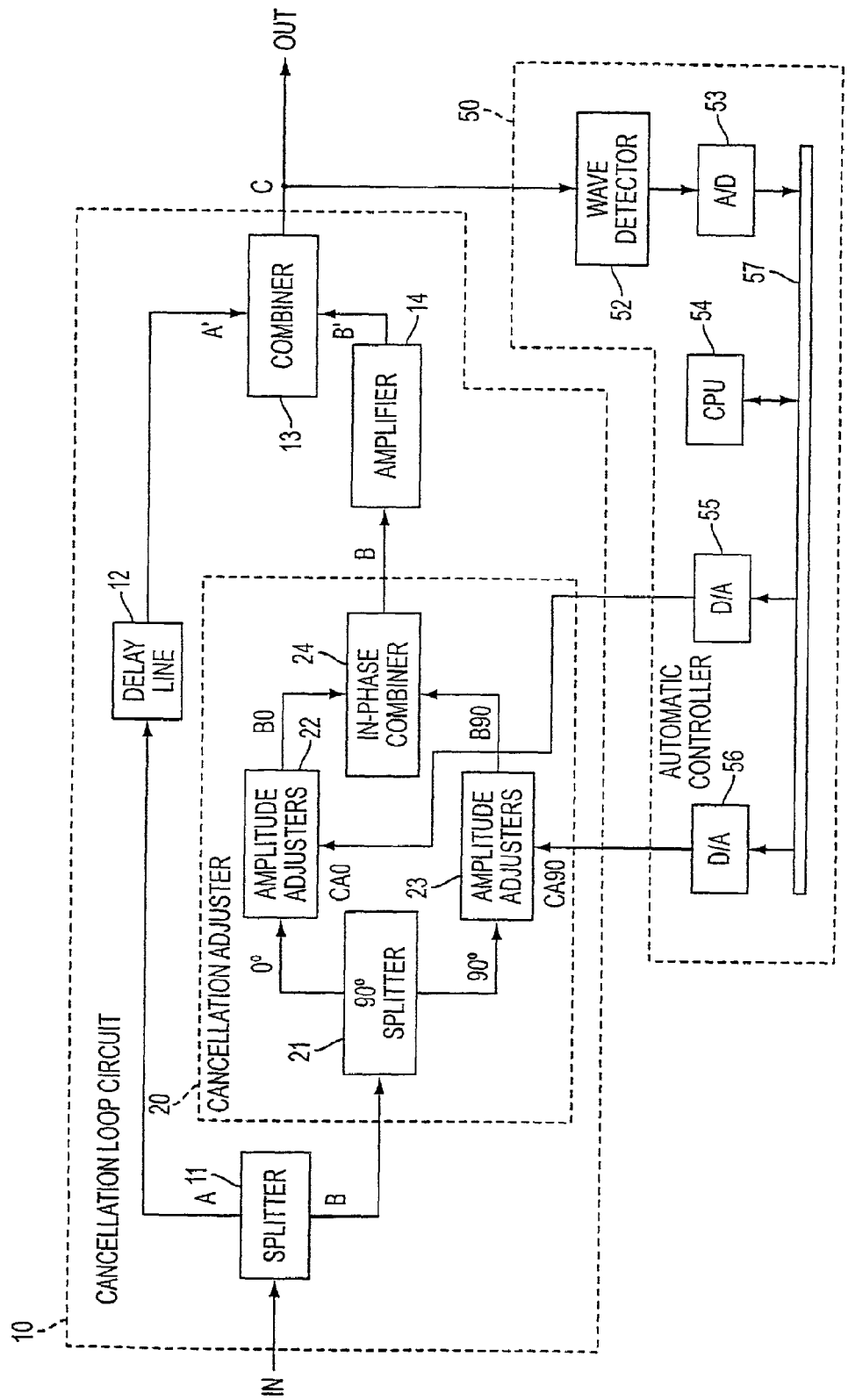
FIG. 2 is a block diagram of an input signal cancellation loop according to a first embodiment of the invention.
Figure 3A:
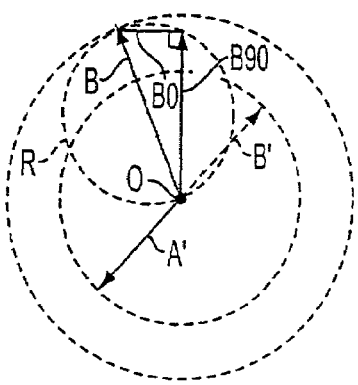
FIGS. 3 (a) through 3(e) diagrammatically explain the input signal cancellation method according to the first embodiment.
Figure 3B:
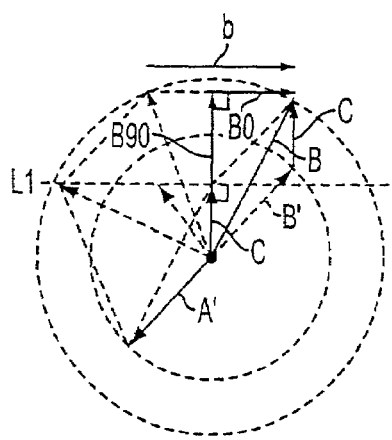
Figure 3D:
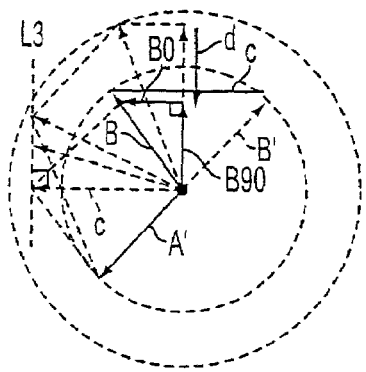
Figure 3C:
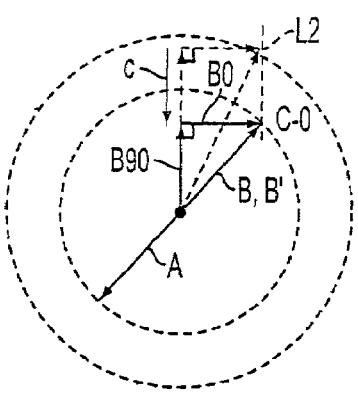
Figure 3E:
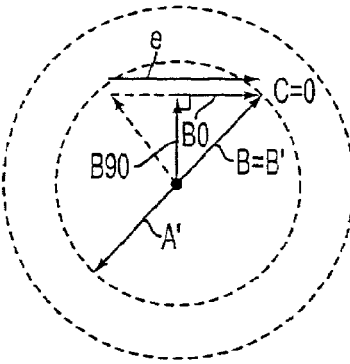
Figure 15:
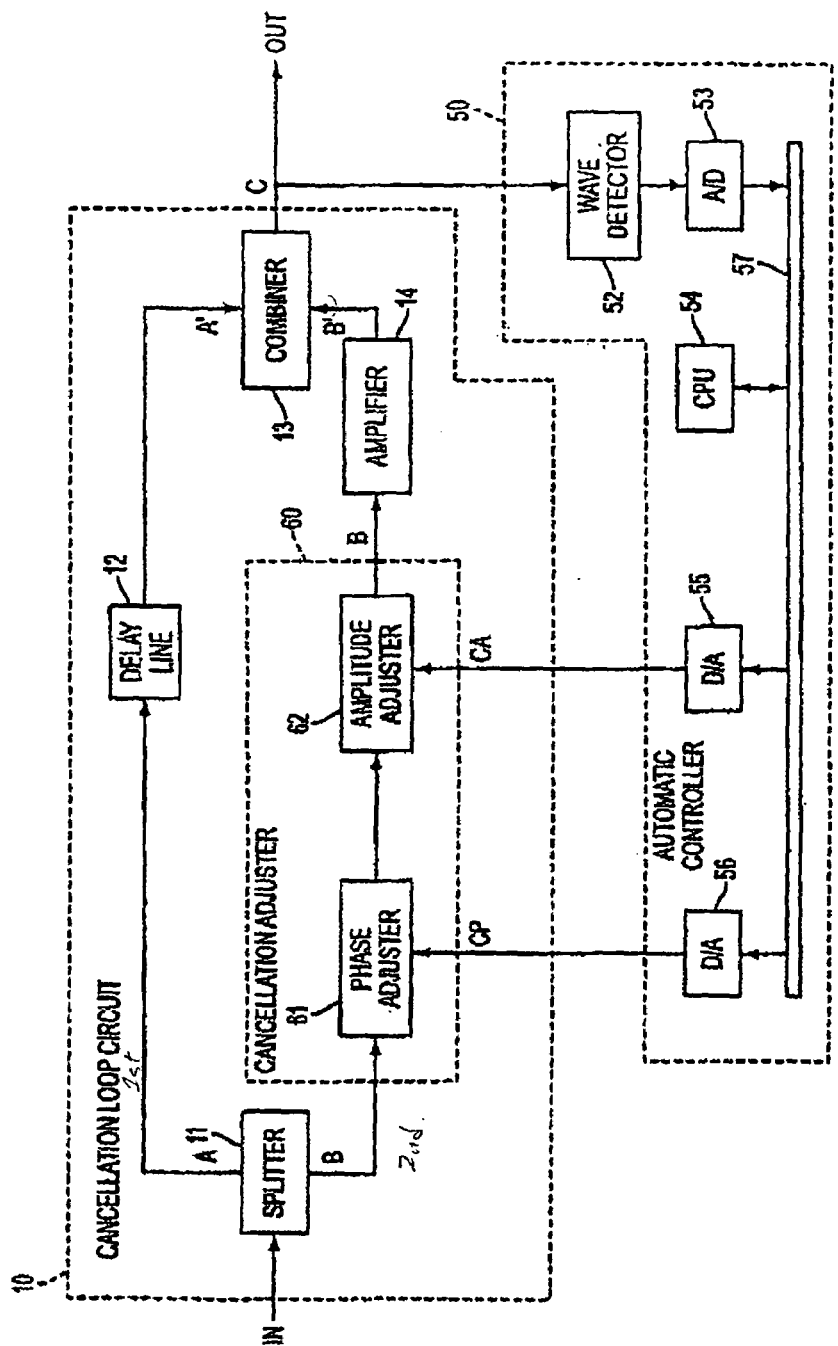
FIG. 15 is a block diagram of a conventional input signal cancellation loop.
Figure 16A:
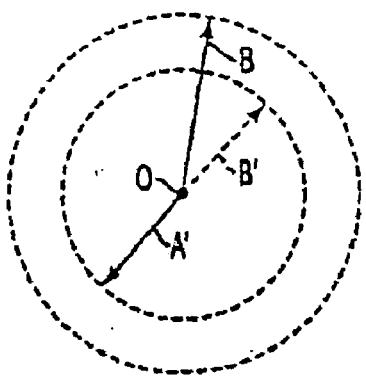
FIGS. 16 (a) to 16(f) show a diagram explaining the conventional input signal cancellation method.
Figure 16D:
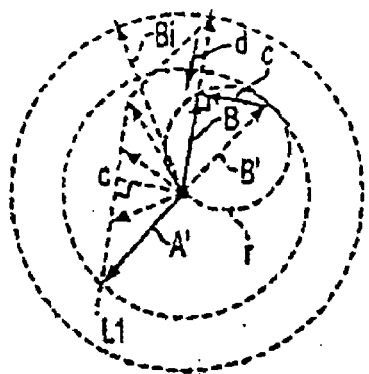
Figure 16B:
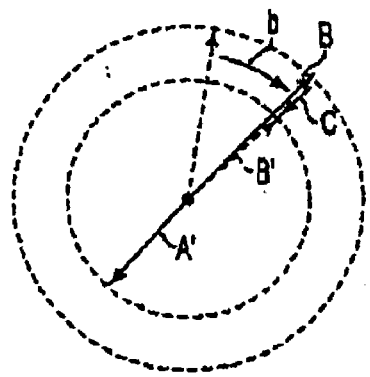
Figure 16E:
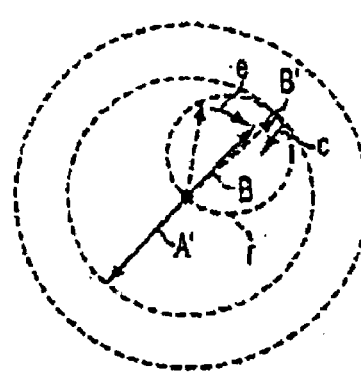
Figure 16C:
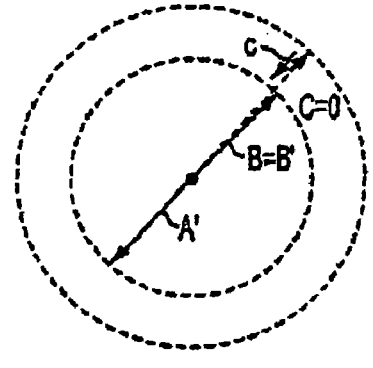
Figure 16F:
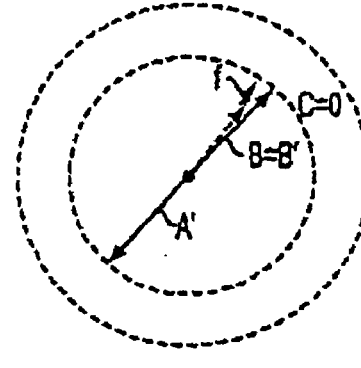
Figure 17A:
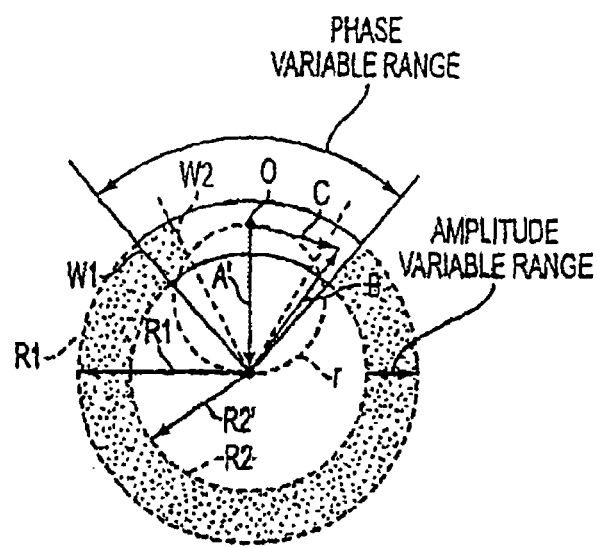
FIG. 17 (A) is a diagram explaining the control range by vector expression, according to a conventional method.
FIG. 17(B) represents the control range of FIG. 17A in the form of a graph.
Figure 17B:
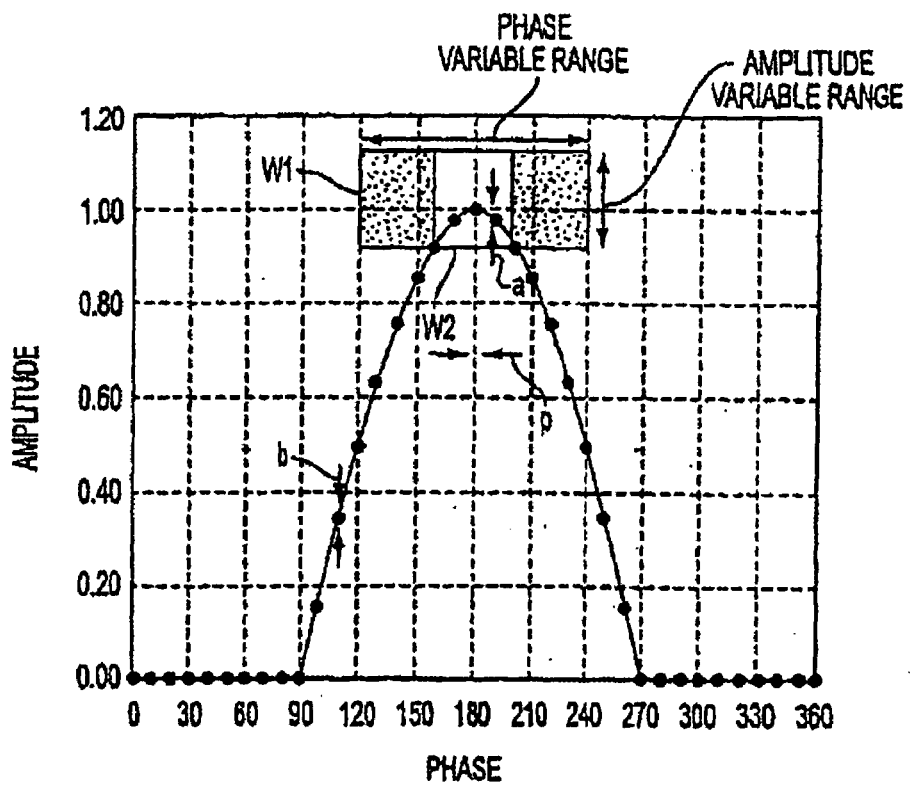

FIG. 2 is a block diagram of an input signal cancellation loop in accordance with the first 1. In the figure, 10 represents a cancellation loop circuit according to Embodiment 1, 20 a cancellation adjustment part, 21 a 90° splitter, 22 and 23 amplitude adjusters which can change (bi-phase operation) their output signal from forward phase to reverse phase, and 24 an in-phase combiner. The other constituents are similar to those explained in FIG. 15 above.

To explain the essential aspects of the operation, a given signal of the input IN is split (where the ratio can be selected freely) into the 2 signals A and B by the splitter 11, and one signal A is delayed by the delay line 12 and becomes a delay signal A'. The other signal B is split into orthogonal subsignals (where the ratio can be selected freely) by means of the 90° splitter 21, one signal of which undergoes amplitude adjustment independently from the amplitude adjuster 23 by means of the amplitude adjuster 22, becoming the subsignal B0, and the other of which undergoes amplitude adjustment independently from the amplitude adjuster 22 by means of the amplitude adjuster 23, becoming the subsignal B90. These subsignals B0 and B90 are combined by an in-phase combiner 24, amplified by an amplifier 14, and become the cancellation signal B' for canceling the delay signal A'. Further, the two signals A' and B' are combined by a combiner 13 to become a composite signal C of the output OUT.

Meanwhile, in this state, the automatic controller 50 monitors the amplitude of the composite signal C, controls the amplitude of the amplitude adjusters 22 and 23, respectively in time division so that said amplitude becomes ≈0, and by this means adjusts the cancellation signal B' to the opposite phase as the delay signal A', and thus cancels the input signal.

A 180° combiner may also be used in place of the aforesaid in-phase combiner 24. In this case, the mutually orthogonal subsignals B0 and B90 can be orthogonally combined.

Moreover, the foregoing in-phase splitter 11, in-phase combiner 13, and delay line 12 are used, but the configuration is not limited to these. Ultimately, if the delay signal A' can be canceled by the cancellation signal B', factors such as whether the splitter 11 and combiner 13 are in phase or out of phase and the amount of delay of the delay line 12 do not matter. This fact is the same in the other embodiments described below.

FIG. 3 is a factor diagram explaining the input signal cancellation method of the first embodiment. When the initial status at a certain point in the circuit is represented as (a), the cases where adjustment is performed first from phase (b) and (c) from the subsignal B0, and cases where adjustment is performed first from amplitude (d) and (e) of the subsignal B90 are respectively indicated in time sequence.

In the initial status shown in FIG. 3 (*a*), signal B can assume various phases and amplitudes with respect to the signal A' that is the object of cancellation. By adjusting this signal B so that it becomes signal B', the signal A' can be canceled. In order to realize this, in this Embodiment 1, the signal B is split into mutually orthogonal subsignals B0 and B90. The split ratio of the subsignals B0 and B90 may be set freely in advance, and can be set in advance in a range which is able to form a right triangle that is internally tangent to the circle R having the signal B as its diameter.

When starting the amplitude adjustment from the subsignal B0, the sequence advances from FIG. 3 (*a*) to FIG. 3 (*b*). In FIG. 3 (*b*), by changing the amplitude of the subsignal B0 in the direction of the arrow b (in this example, the sign/phase are also inverted during the process), the amplitude of the composite signal C becomes minimal at the point where the head of the subsignal B0 intersects a perpendicular line placed at the head of the signal B'.

Specifically, the composite signal (positional vector) C of the signals A' and B, by reducing the amplitude of the subsignal B0, moves on the broken-line segment L1 parallel to the subsignal B0, as shown in figure, but the amplitude of the composite signal C becomes minimal when the composite signal C and the segment L1 orthogonally intersect. At this time, since the aforesaid composite signal C is parallel to the subsignal B90, next the signal C can be deleted easily by amplitude adjustment of the subsignal B90. In other words, in FIG. 3 (*c*), when the amplitude of the subsignal B90 is reduced in the direction of the arrow c, the amplitude of the composite signal C becomes minimal (C=0) at the point where the head of the subsignal B0 intersects the head of the signal B'.

When starting the amplitude adjustment from the subsignal B90, the sequence advances from FIG. 3 (*a*) to FIG. 3 (*d*). In FIG. 3 (*d*), by changing the amplitude of the subsignal B90 in the direction of the arrow d, the amplitude of the composite signal C becomes minimal at the point where the head of the subsignal B90 intersects a perpendicular line placed at the head of the signal B'.

Specifically, the composite signal (positional vector) C of the signals A' and B, by reducing the amplitude of the subsignal B90, moves on the broken-line segment L3 parallel to the subsignal B90, as shown in figure, but the amplitude of the composite signal C becomes minimal when the composite signal C and the segment L3 orthogonally intersect. At this time, since the aforesaid composite signal C is parallel to the subsignal B0, next this signal C can be deleted easily by amplitude adjustment of the subsignal B0. In other words, in FIG. 3 (*e*), when the amplitude of the subsignal B0 is changed in the direction of the arrow e, (in this example, sign/phase are inverted during the process), the amplitude of the composite signal C becomes minimal (C=0) at the point where the head of the subsignal B0 intersects the head of the signal B'.

Figure 4:
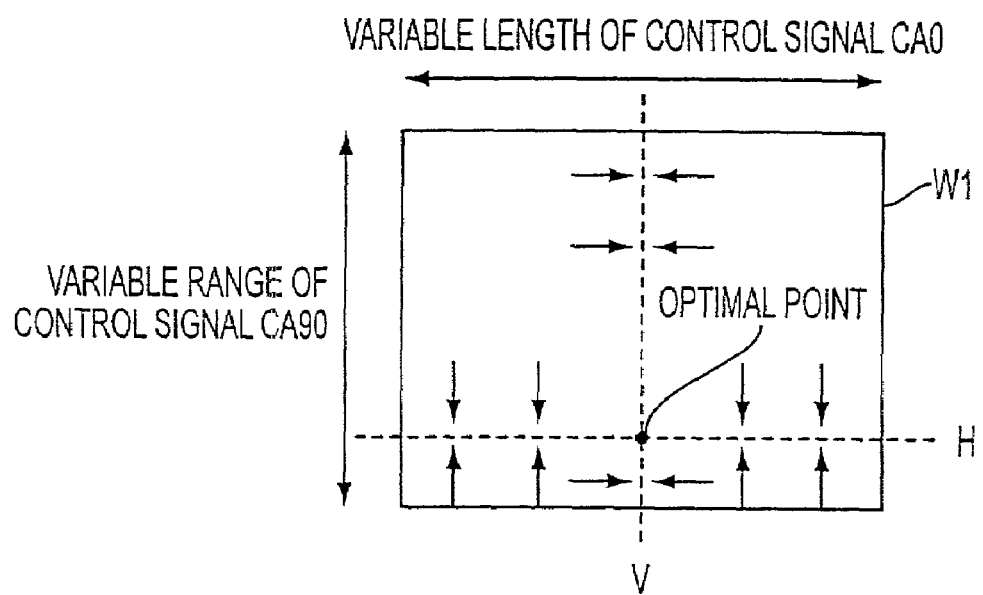
FIG. 4 is a diagram explaining the control range of the first embodiment.

FIG. 4 is a diagram showing the control range according to the first embodiment. Here, the variable range of the control signals CA0 and CA90 corresponding to the circuit configurations (settings), etc., of the amplitude adjusters 22 and 23 are shown, and the inside of this region W1 becomes the physical and practical control range. When the optimal point of the cancellation control is made "•", the subsignal B0 is always focused on the segment V in accordance with the control signal CA0, and the subsignal B90 is always focused on the segment H in accordance with the control signal CA90. These controls are mutually independent. Thus, unstable control regions do not exist within the region W1, and each amplitude control in uniformity quickly focuses toward the optimal point. Moreover, this control range W1 can be fixed at the desired width, and unstable control regions do not exist over the entire control range.

Figure 5A:
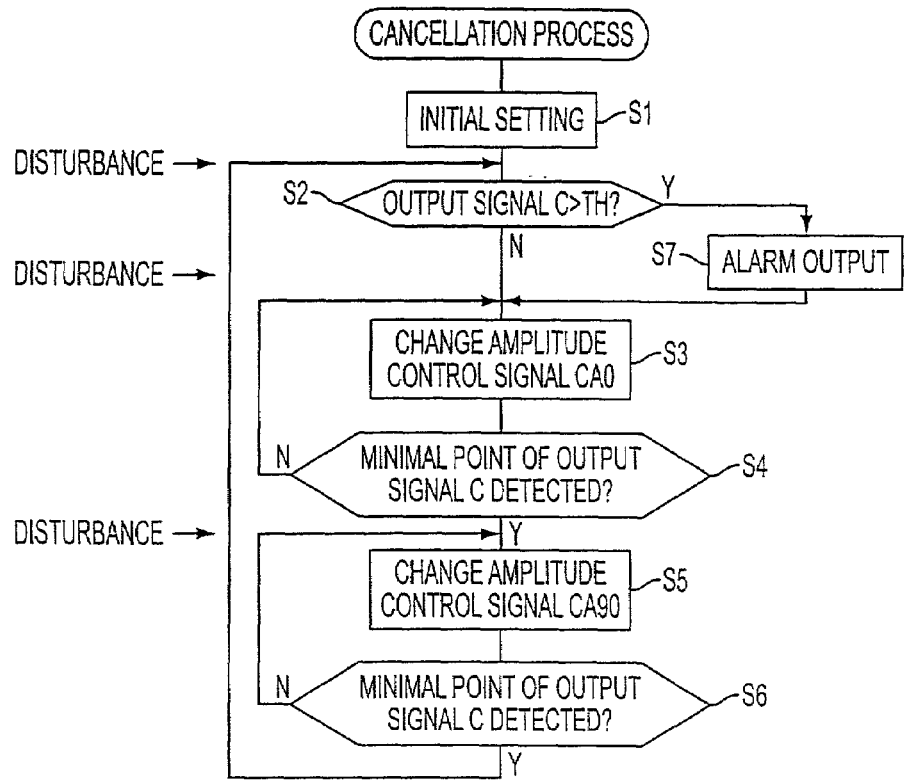
FIGS. 5 (A) and 5(B) show a flowchart of the automatic control operation of the first embodiment.
Figure 5B:
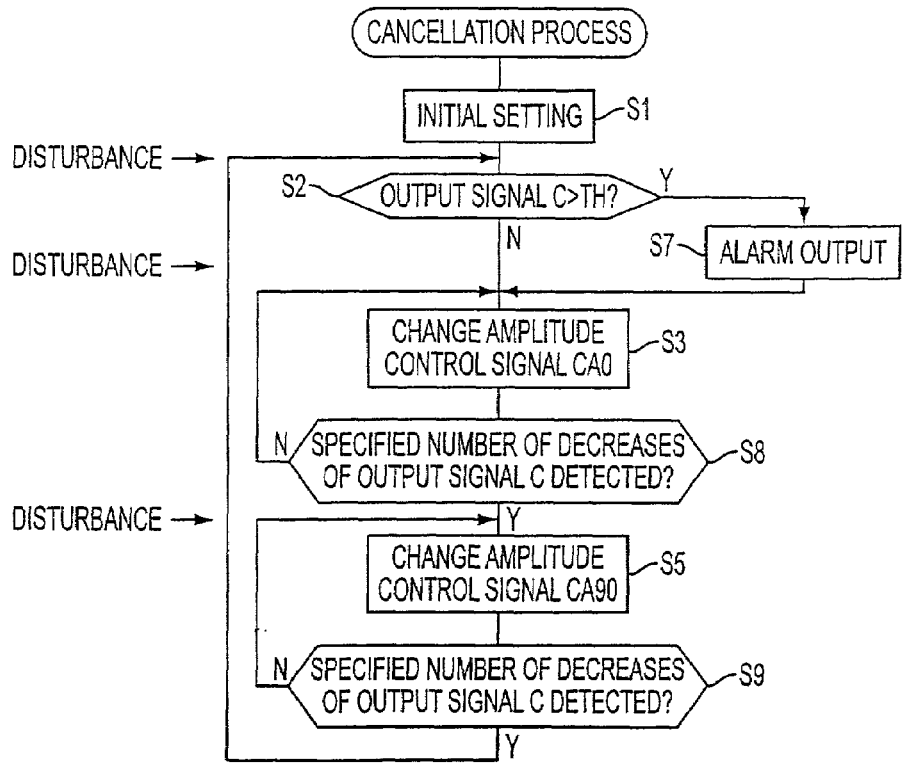

FIG. 5 is a flowchart showing the automatic control process of Embodiment 1, FIG. 5 (A) showing an example of an automatic control process, where this process is entered when the power to the circuit is switched on. In step S1, initial setting of the amplitude adjusters 22 and 23, etc., is performed in accordance with the default parameters. In step S2, it is determined whether the amplitude of the output signal C>TH (specified threshold value). If C>TH, the amplitude C of the output signal exceeds the permitted range, so after an alarm signal is output in step S7, the process advances to step S3. If C is not greater than TH, then the process advances directly to step S3.

In step S3, the phase control signal CA0 is changed slightly in one direction. In step S4, it is determined whether or not the minimal point of the output signal C has been detected, and if the minimal point has not been detected, the sequence returns to step S3. When the output signal C has ceased decreasing and begins to increase during the process of the continued repetition of steps S3 and S4, then the minimal point has been detected, and otherwise, there has been no minimal point detection. Also, in this case, when the output signal C increases from the initial change of the aforesaid amplitude control signal CA0, the direction of change of the phase adjustment signal CP is reversed.

When in due course there has been minimal point detection according to the discrimination in the aforesaid step S4, in step S5, the amplitude control signal CA90 is slightly changed in one direction. In step S1, it is determined whether there has been minimal point detection of the output signal C, and if there is no minimal point detection, the sequence returns to step S5. When minimal point detection occurs in due course, the sequence returns to step S2. The processes of the aforesaid steps S2 and S7 may be provided so as to follow the aforesaid step S6.

FIG. 5 (B) shows another example of automatic control processing according to Embodiment 1, where, instead of the above-described minimal point detection of the output signal C, a specified number (such as approximately 1 time to 5 times) of continuous decreases is detected. The same step numbers are used for steps which correspond to those in the process shown in FIG. 5 (A), and the explanation thereof is omitted. In step S8 in this process, it is determined whether a specified number of decreases in the output signal C have been detected, and if there has been no such detection, the sequence returns to step S3. If the output signal C in the repeated series of steps S3 and S8 begins to increase after decreasing, then the process skips step S8 to the Yes side. If the output signal C increases from the initial change in the phase adjustment signal CA0, then the direction of change of the phase adjustment signal CA0 is reversed. Similarly, in step S9, it is determined whether the specified number of decreases in the output signal C has been detected, and if not detected, the sequence returns to step S5. Then, when in due course the specified number of decreases has been detected, the sequence returns to step S2.

As explained in the foregoing FIG. 3, no matter from which subsignal B0/B90 amplitude control in accordance with Embodiment 1 is started, the signal A' can be uniformly canceled in the amplitude control of the next subsignal B90/B0. Accordingly, no matter in which step in FIG. 5 (A)/(B) a disturbance (such as a sudden fluctuation in the phase/amplitude of signal B/A', for example) occurs, the cancellation control of the CPU 54 will continue stably.

Figure 18A:
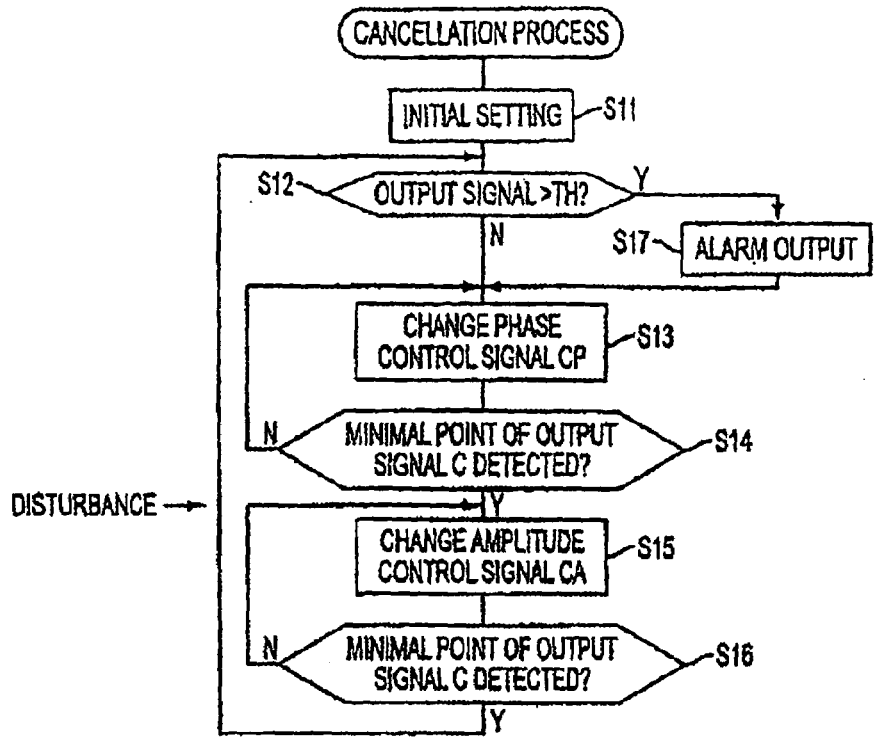
FIGS. 18 (A) and 18 (B) is a flowchart of a conventional automatic control process.
Figure 18B:
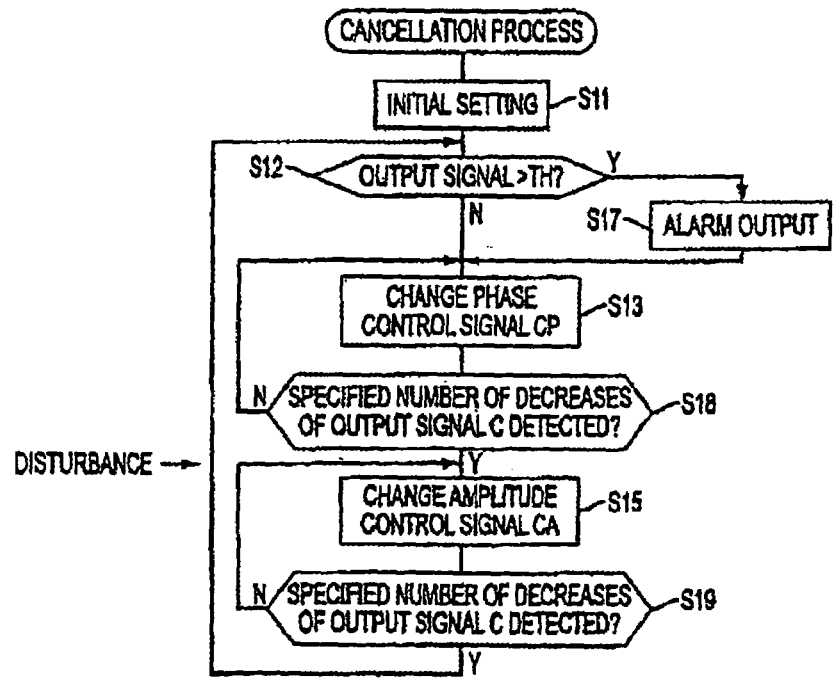

It should be noted that, when the flow charts of the aforesaid FIG. 18 (A), (B) and FIG. 5 (A), (B) are compared, both (particularly the algorithms for changing the control signals and detecting the minimal point or specified number of reductions of the output signal C) are the same. On the other hand, the objects of control of the CPU 54 (the hardware configuration of the cancellation adjustment part) differ in being the phase adjuster 61 and amplitude adjuster 62 in FIG. 15 and the amplitude adjusters 22 and 23 in FIG. 2, but it is clear that this fact does not necessitate changing the control algorithm of the CPU 54. Accordingly, the cancellation loop configuration according to the present invention has the advantage that conventional (existing) automatic control algorithms (programs) can be used unchanged, and this control can be performed easily.

Figure 6:
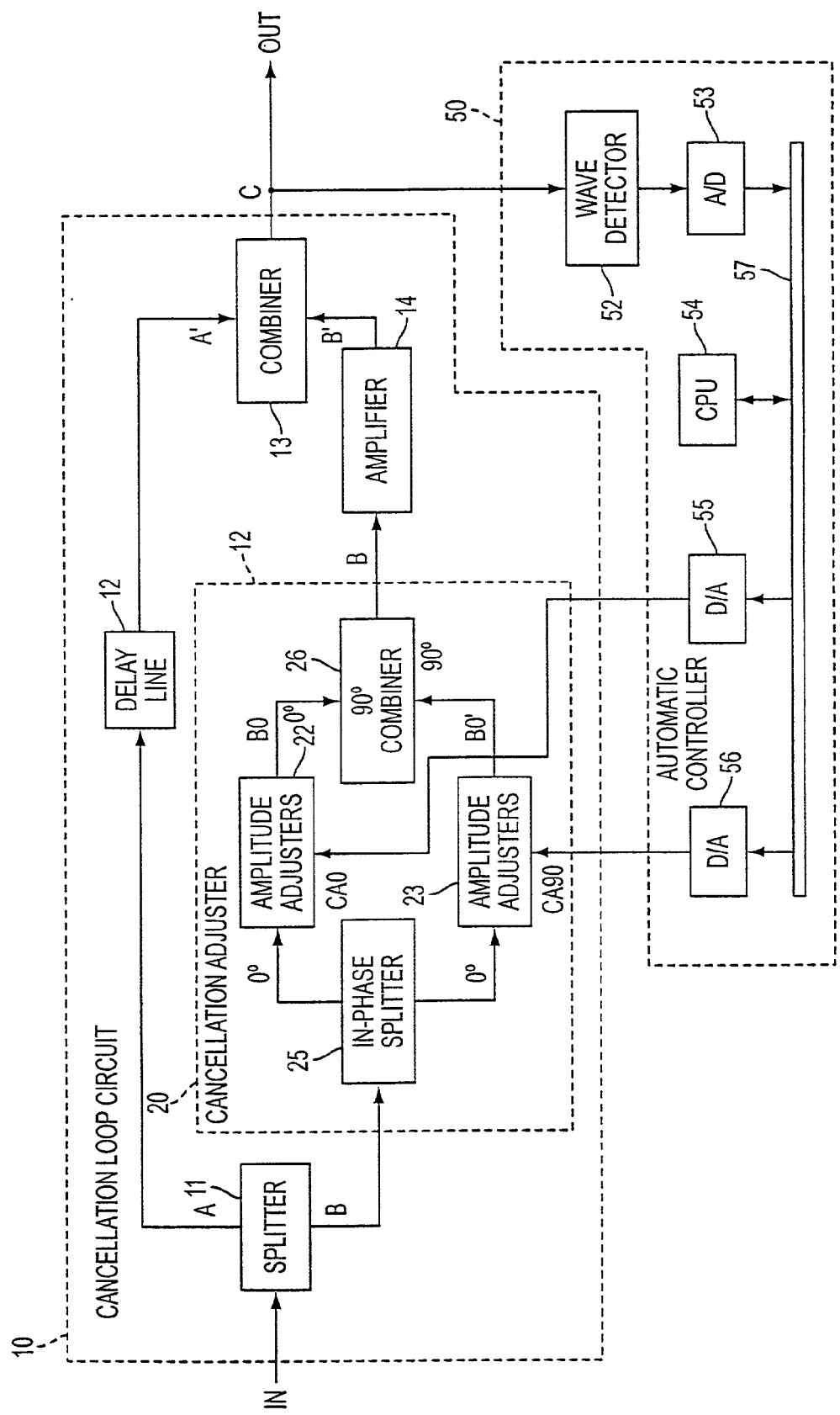
FIG. 6 is a block diagram of an input signal cancellation loop according to a second embodiment of the present invention.

FIG. 6 is a block diagram of an input signal cancellation loop according to the second embodiment and, opposite the case of FIG. 2, shows the case in which the signal B is split in the same phase and recombined in orthogonal phase. In the figure, 20' represents a cancellation adjustment part, 25 as in-phase splitter, and 26 a 90° combiner in accordance with the second embodiment. Otherwise, the configuration may be the same as that of aforesaid FIG. 2.

The input signal B is split into 2 signals in the same phase by the in-phase splitter 25, and after amplitude adjustment, by recombining the subsignals B0 and B0' in 90° phase difference by the 90° combiner 26, a composite signal B similar to that in the aforesaid Embodiment 1 can be obtained as the output thereof.

A 180° splitter 25 may be used instead of the aforesaid in-phase splitter 25. In this case as well, the subsignals B0 and B0', which are in mutually inverted phase, can be orthogonally combined.

Figure 7:
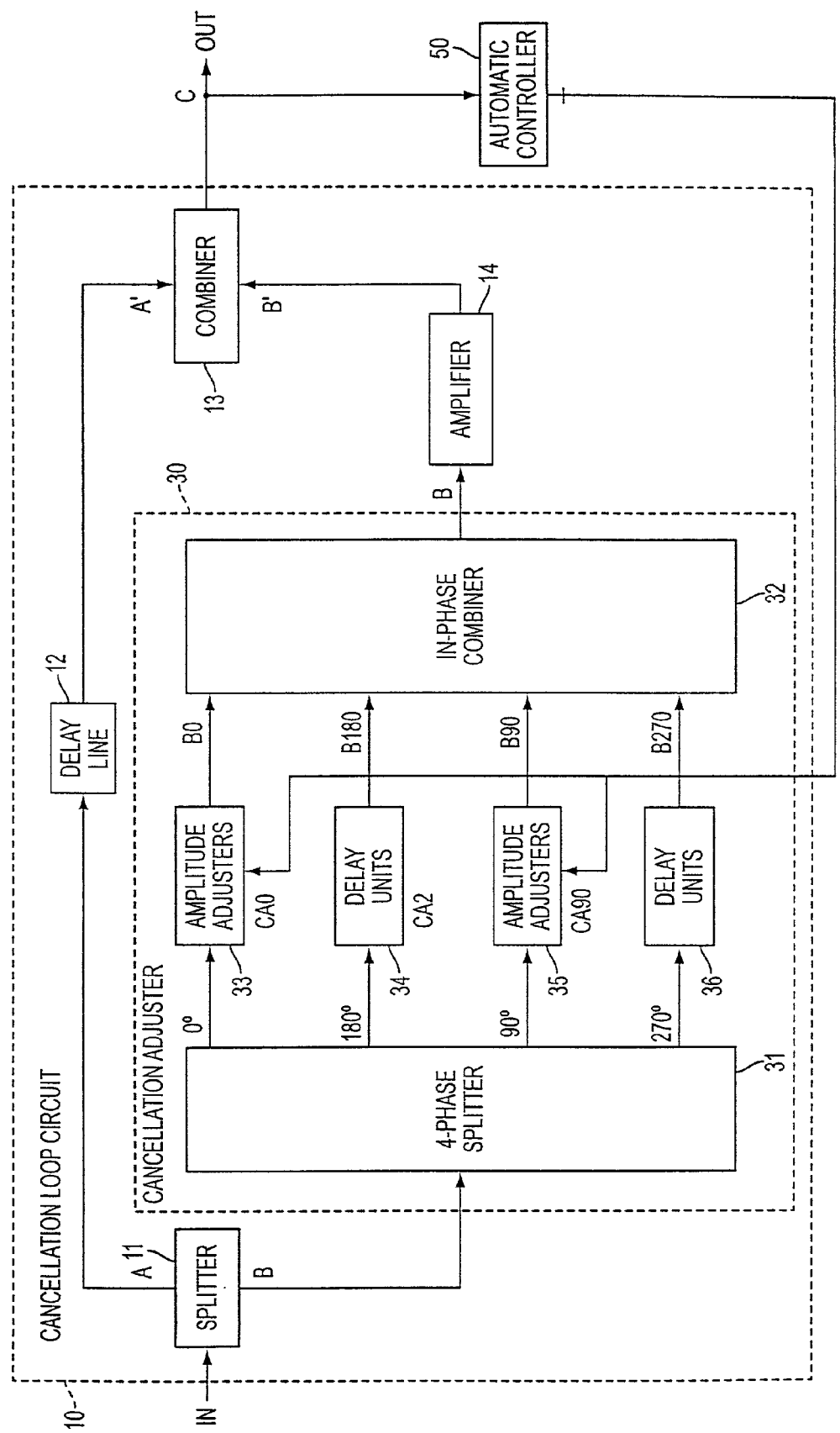
FIG. 7 is a block diagram of an input signal cancellation loop according to a third embodiment of the present invention.

FIG. 7 is a block diagram of an input signal cancellation loop according to the third embodiment, and shows the case in which an amplitude adjustment function that is able to perform overall bi-phase operation is realized by combining normal simple signal adjusters (which operate in single phase) and delay units. In FIG. 7, 30 represents a cancellation adjuster according to Embodiment 3, 31 a 4-phase splitter, which splits (where the ratio can be freely selected) the input signal B into subsignals having 4 phases (0°, 180°, 90°, and 270°), 33 an amplitude adjuster, which can drive the output signals in forward phase or reverse phase (can perform single-phase operation), (34 a delay unit (delay line, amplifier, etc.), which has an equal delay time as the amplitude adjuster 33, 35 an amplitude adjuster which operates in single phase, 36 a delay unit (delay line, amplifier, etc.) which has a delay time equal to that of the amplitude adjuster 35, and 32 as in-phase combiner, in accordance with the third embodiment 3. Otherwise, the constitution is similar to that shown in FIG. 2.

The amplitude adjuster 33 and delay unit 34 are supplied the subsignals of opposite phase (0°, 180°), from the 4-phase splitter 31, and, together with the in-phase combiner 32, realize the amplitude adjustment function which can perform by-phase operation overall. Similarly, the amplitude adjuster 35 and delay unit 36 are supplied the subsignals of opposite phase (90°, 270°), from the 4-phase splitter 31, and, together with the in-phase combiner 32, realize the amplitude adjustment function which can perform by-phase operation overall. The principle of its operation is described below.

Figure 8A:
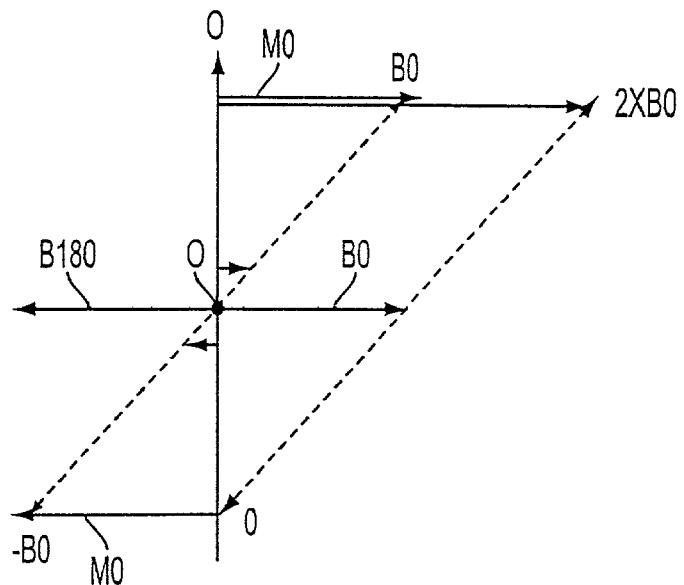
FIGS. 8 (A) and 8(B) show a diagram explaining the bi-phase operation of the third embodiment.
Figure 8B:
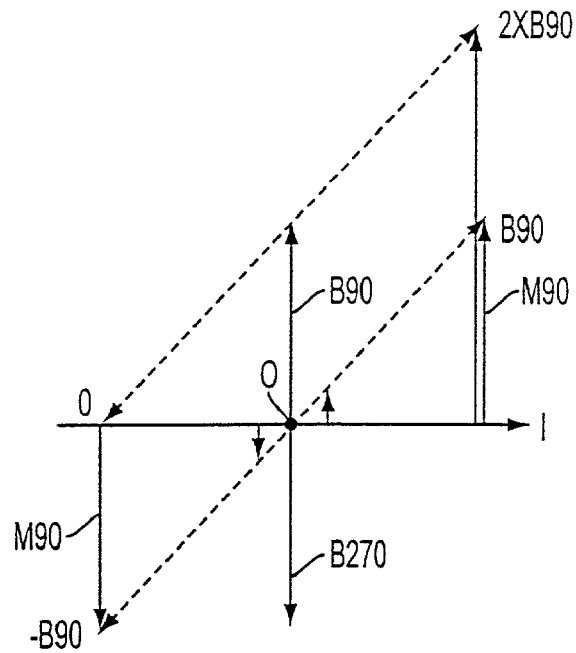

FIGS. 8(A) and 8(B) show an explanatory diagram of the bi-phase operation of the third embodiment FIG. 8 (A) depicts by vector diagram the bi-phase operation of the composite signal produced by the combination of the amplitude adjuster 33 and delay unit 34. In the figure, the subsignal B0 of the output of the amplitude adjuster 33 and the subsignal B180 of the output of the delay unit 34, which has a 180° phase difference therewith, are indicated as having the same amplitude.

Now, when the amplitude of the subsignal B0 is made 0, the composite signal M0 of the subsignal B0 and subsignal 180 in the in-phase combiner 32 is equal to the subsignal −B0 in which the sign (phase) of the subsignal B0 has been reversed. Moreover, when the amplitude of the subsignal B0 is increased from this point, the sign (phase) of the amplitude of the corresponding composite signal M0 remains "−" (reverse-phase), when the amplitude of the subsignal B0 in due course becomes B0, the amplitude of the composite signal M0 becomes 0, and with this as a boundary the sign (phase) is reversed from "−" (reverse-phase) to "+" (in-phase). When the amplitude of the subsignal B0 further increases from this point, the amplitude of the corresponding composite signal M0 continues to increase with the sign (phase) as "+" (in-phase), and when the amplitude of the subsignal B0 in eventually 2×B0, the composite signal M0 thereof becomes equal to the subsignal B0. In this way, by the simple combination of the amplitude adjuster 33 and delay unit 34, a composite signal M0 for which bi-phase operation is possible is obtained in the in-phase combiner 32.

FIG. 8 (B) shows the bi-phase operation of the composite signal obtained by the combination of the amplitude adjuster 35 and delay unit 36, and here, the subsignal B90 of the output of the amplitude adjuster 35 and the subsignal B270 of the output of the delay unit 36, which has a phase difference of 180° therewith, are indicated as having the same amplitude. In the same way as described above, when the amplitude of the subsignal B90 is changed from 0 to 2×B90, the composite signal M90 of the subsignals B90 and B270 in the in-phase combiner 32 changes from the status of subsignal −B90 to the status of subsignal B90.

In this way, by a simple combination of the amplitude adjuster 35 and delay unit 36, in the in-phase combiner 32, a composite signal M90, which is orthogonal to the aforesaid composite signal M0, and also allows bi-phase operation, can be obtained. Accordingly, by further combining the composite signal M0 and M90 in the in-phase combiner 32, a composite (cancellation) signal B which can be expanded freely in the first through fourth quadrants of the vector plane can be obtained in the output thereof. In this case, moreover, the automatic controller 50 is always able to cancel the input signal stably by an amplitude control process similar to that in the aforesaid FIG. 5.

The settings of the amplitudes (or the output amplitudes from the splitter 31 to the delay units 34 and 36) of the delay units 34 and 36 can be changed, and by this means, as is clear from FIG. 8, the adjustment ranges of the orthogonal composite signals M0 and M90 can be freely changed (shifted).

Moreover, in the input of the amplifier 14, if the relative phases of the subsignal components which pass through the amplitude adjuster 33, delay unit 34, amplitude adjuster 36, and delay unit 35, respectively, are the relation of 0°, 180°, 90°, and 270°, the combination of phases of the splitter 31 and combiner 32 does not matter. For example, a 4-phase splitter 31 may be used in place of the in-phase splitter 31, or an in-phase combiner 32 in place of the 4-phase combiner 32.

Figure 9:
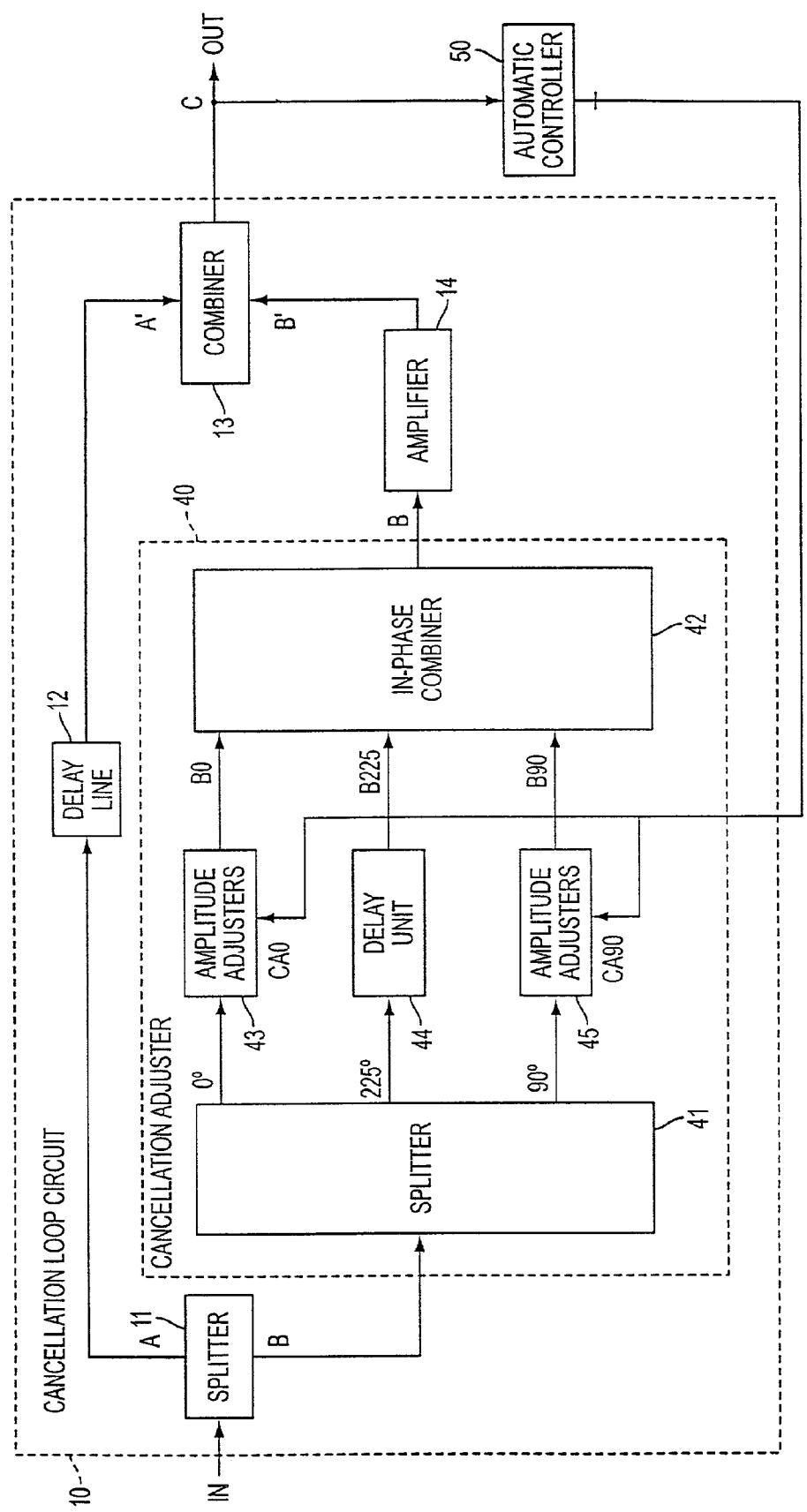
FIG. 9 is a block diagram of an input signal cancellation loop according to a fourth embodiment of the present invention.

FIG. 9 is a block diagram of an input signal cancellation loop according to Embodiment 4, and shows the case in which the delay units 34 and 36 the aforesaid in FIG. 7 are realized by a single delay unit 44. In the figure, 40 represents a cancellation adjuster, 41 a splitter, which splits the input signal B into 3 subsignals having 3 phases (0°, 225°, 90°)(where the ratio may be selected freely), 43 and 45 amplitude adjusters which operate in single phase, 44 a delay unit (delay line, amplifier, etc.), which has a delay time equal to that of the amplitude adjusters 43 and 45, and 42 an in-phase combiner, in accordance with Embodiment 4. Otherwise the configuration is similar to that shown in FIG. 7 above.

Figure 10:
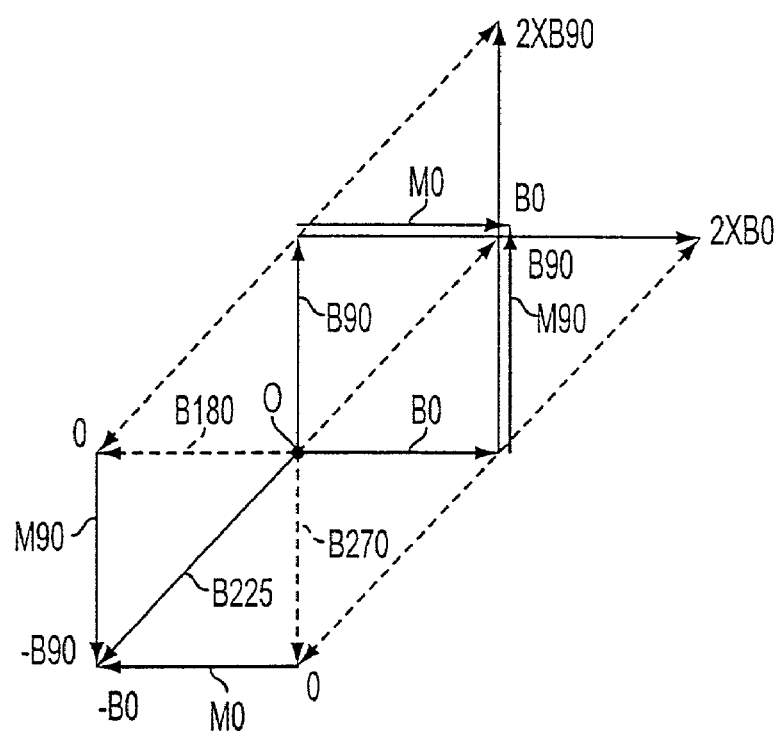
FIG. 10 is a diagram explaining the bi-phase operation of the fourth embodiment.

FIG. 10 is a diagram explaining the bi-phase operation in Embodiment 4, showing the bi-phase operations of the orthogonal composite signals M0 and M90 produced by the combination of the amplitude adjusters 43 and 45 with the delay unit 44 in the form of a vector diagram. In the figure, the subsignals B0 and B90 of the outputs of amplitude adjusters 43 and 45 and subsignal B225 of the output of the delay unit 44 are shown in each corresponding phase around origin point O. The amplitude of the subsignal B225 has the size of $\sqrt{(2)}$ times the amplitude of subsignals B0 and B90, and the subsignals B180 and B270, resolving this into its orthogonal components, have the same amplitude and the opposite phase as the respective subsignals B0 and B90.

Accordingly, when the amplitude of the subsignal B0 is changed from 0 to 2×B0, the composite signal M0 of the subsignals B0 and B180 in the in-phase combiner 42 changes from the status of subsignal −B0 to the status of subsignal B0. Moreover, when the amplitude of subsignal B90 is changed from 0 to 2×B90, the composite signal M90 of the subsignals B90 and B270 in the in-phase combiner 42 changes from the status of subsignal −B90 to the status of subsignal B90. In this case as well, since the subsignals B0 and B90 which are the object of amplitude control are mutually orthogonal, the composite signals M0 and M90 can be controlled independently.

Additionally, the composite signals M0 and M90 obtained are mutually orthogonal, and by combining these in the same phase by means of the in-phase combiner 42, a composite (cancellation) signal B which can be expanded as desired over the first through fourth quadrants in the vector plane is obtained in the output thereof. The automatic controller 50 in this case can always cancel the input signal stably by an amplitude control process similar to that in the aforesaid FIG. 5.

It should be noted that the setting of the output phase 225° of the splitter 41 and/or the degree of amplification (or the output amplitude from the splitter 41 to the delay unit 44) of the delay unit 44 can be changed, and by this means, as is clear from FIG. 10, the adjustment ranges of the orthogonal composite signals M0 and M90 can be changed (shifted) freely. In this connection, when the output phase 225° of the splitter 41 (i.e., the phase of the subsignal B225) is changed, the ratio of amplitude of the orthogonal signals B180 and B270 are changed, and as a result, the respective adjustment ranges of the composite signals M0 and M90 are also changed (shifted).

Furthermore, so long as the relative phases of the signal components which have passed through the respective amplitude adjuster 43, delay unit 44, and amplitude adjuster 45 in the input of the amplifier 14 are in the relation of 0°, e.g. 225°, and 90°, the combination of phases of the splitter 41 and combiner 42 does not matter. For example, the 3-phase splitter 41 may be replaced with an in-phase splitter 41, and the in-phase combiner 42 may be replaced with a three-phase combiner 42.

Figure 11:
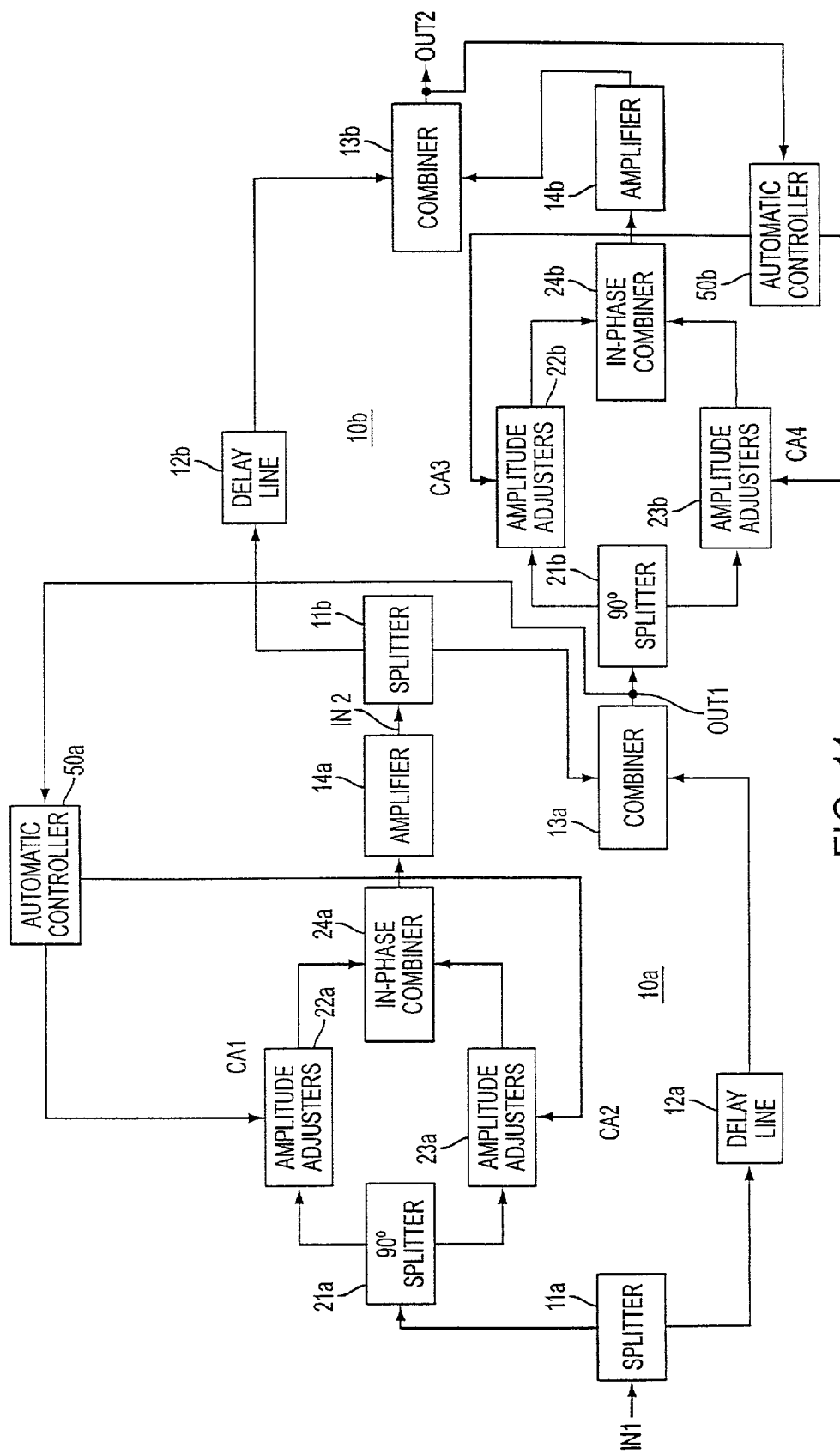
FIG. 11 is a block diagram showing a feed-forward amplifier of the invention.
Figure 13A:
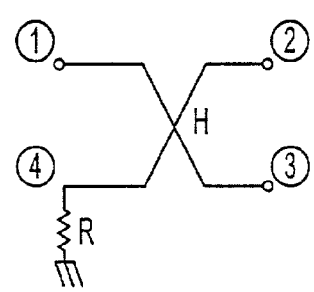
FIGS. 13 (A) through 13 (E) show a diagram (1) showing examples of circuits necessary to constitute each functional block.
Figure 13B:
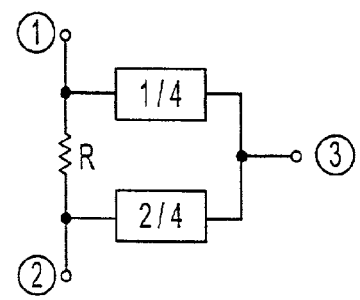
Figure 13C:
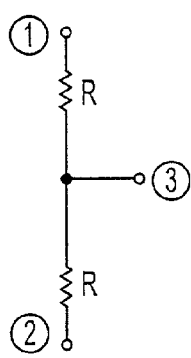
Figure 13D:
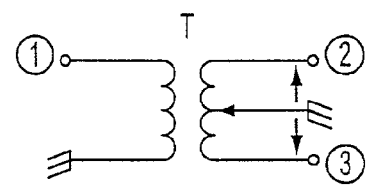
Figure 13E:
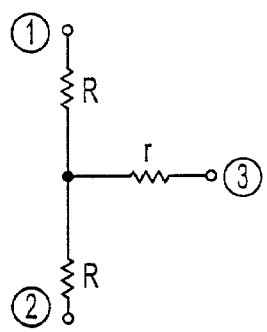
Figure 14A:
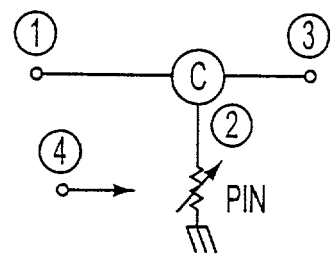
FIGS. 14 (A)–14(D) show a diagram (2) showing examples of circuits necessary to constitute each functional block.
Figure 14B:
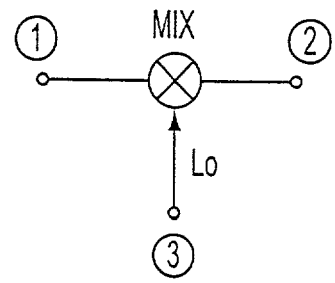
Figure 14C:
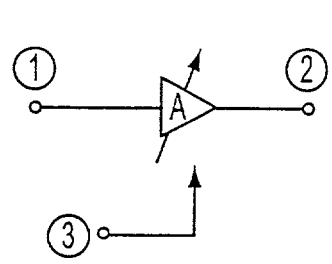
Figure 14D:
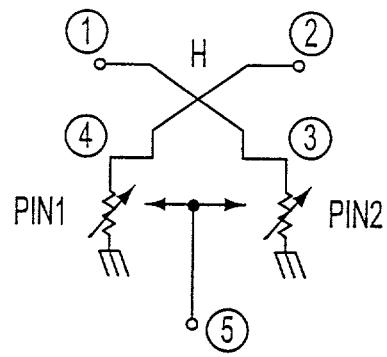

FIG. 11 is a block diagram of a feed-forward amplifier according to an embodiment of the present invention, and indicates an example of the application of the signal cancellation loop, e.g., according to the aforesaid Embodiment 1 to a feed-forward amplifier. This feed-forward amplifier basically is constituted by preparing 2 signal cancellation loop circuits 10a and 10b in FIG. 2, overlapping the combiner 13a of the output of 1 loop circuit 10a with the splitter 11b of the input of the other loop circuit 10b, connecting the two circuits 10a and 10b in vertical sequence, using the loop circuit 10a of the pre-stage as a distortion extraction loop and the loop circuit 10b of the next stage as a distortion removal (cancellation) loop, and, overall, amplifying the mean signal of the input IN1 without distortion and sending it to the output OUT.

In this feed-forward amplifier, when the main signal of the input IN1 is amplified by the amplifier 14a, generally, the main signal is distorted by the amplifier 14a and the distortion component is superimposed on the main signal. Accordingly, the pre-stage distortion extraction loop 10a is used to extract this distortion component (i.e., cancel the main signal component), and the distortion element is removed by the post-stage distortion cancellation loop 10b.

In this case, the automatic controller 50a performs time-division control on the amplitude adjusters 22a and 23a so that the main signal component of the output signal OUT1 is detected and this main signal component is canceled (amplitude≈0), and the automatic controller 50b performs time-division control on the amplitude adjusters 22b and 23b so that the distortion component of the output signal OUT2 is detected and this distortion component is canceled (amplitude≈0).

FIG. 12 is a spectrum diagram explaining the operation of the feed-forward amplifier according to this embodiment. In FIG. 12 (a), the main signal having a desired bandwidth is input to the input IN1. In FIG. 12 (b), by amplifying the main signal of the input with the amplifier 14, distortion is produced, in the input IN2 of the next stage the distortion component is superimposed on the main signal, and this is split into 2 (with the ratio selected freely) by the splitter 11b. Here, although not shown in the figure, generally, in the pre-stage or post-stage of the amplifier 14a, a pilot signal analogous to the distortion component is injected, and this is used in the control of the distortion cancellation loop.

FIG. 12 (c), one of the split main signals containing the aforesaid distortion is input to a delay time 12b, the other is combined in reverse-phase with the delayed main signal by the combiner 13a, and by this means only the main signal component is canceled (the distortion component is removed) at the output OUT1. In FIG. 12 (d), the delayed signal of the main signal containing the distortion and the cancellation signal composed only of the distortion component are combined by the combiner 13b in reverse phase, and by this means only the main signal in which the distortion component has been sufficiently suppressed is sent to the output OUT2.

Needless to say, a feed-forward amplifier may be constituted by means of any signal cancellation loop described in the aforesaid Embodiments 2–4 instead of the signal cancellation loop according to the aforesaid Embodiment 1. Furthermore, combination with different types of signal cancellation loops among those described in the foregoing embodiments is also possible. Signal cancellation loops described in the foregoing embodiments may also be combined with conventional type signal cancellation loops.

FIG. 13 and FIG. 14 are diagrams (1) and (2) showing examples of circuits necessary to realize the functional blocks in the aforesaid embodiments, and FIG. 13 shows examples of various circuits for splitters combiner. FIG. 13 (A) shows an example of a 90° splitter-combiner which uses a directional coupler (hybrid H) or the like, and wherein signals input from the terminal ① are distributed in 90° phase difference to the terminals ② and ③, and signals input in 90° phase difference to the terminals ② and ③ are synthesized in-phase at the terminal ①. By combining these in multiple stages, a multi-phase splitter-combiner can be constructed.

FIG. 13 (B) shows an example of an in-phase splitter-combiner which uses a λ/4 line (a Wilkinson-type power splitter-converter or the like), wherein signals input from the terminal ③ are distributed in-phase to the terminal ① and ②, while signals input in-phase to the terminals ① and ② are synthesized in-phase by the terminal ③.

FIG. 13 (D) shows examples of a 180° splitter-combiner which uses a transformer T, and wherein signals input from the terminal ① are distributed in 180° phase difference to the terminals ② and ③, and signals input in 180° phase difference to the terminals ② and ③ are synthesized in-phase at the terminal ①.

FIG. 13 (C) and (E) show examples of an in-phase splitter-converter comprising a resistor R, wherein signals input from the terminal ③ are distributed in-phase to the terminal ① and ②, while signals input in-phase to the terminals ① and ② are synthesized in-phase by the terminal ③.

FIG. 14 shows examples of circuits of various types in amplitude adjusters. FIG. 14 (A) shows an example of an amplitude adjuster (which can perform bi-phase operation) in which a circulator C and PIN diode are combined, wherein, when the impedance of the PIN diode equals (matches) the characteristic impedance of the circuit, the signal input from the terminal ① is terminated at the terminal ②, and is not manifested at the terminal ③. When the impedance of the PIN diode becomes larger/smaller than the characteristic impedance, a signal having an amplitude corresponding to the reflection coefficient of the circuit of the terminal ② is manifested at the terminal ③, and its phase is inverted in accordance with whether the PIN diode impedance is larger or smaller than the characteristic impedance. FIG. 14 (B) shows an example of an amplitude adjuster which uses a mixer MIX, whereby bi-phase operation can be performed by changing the voltage of the IF signal. FIG. 14 (C) shows an example of an amplitude adjuster which uses a commercially sold gain control amplifier A, which is able to perform single-phase operation. Moreover, if an OP amplifier form is possible, bi-phase operation can be performed.

FIG. 14 (D) shows an example of an amplitude adjuster (which can perform bi-phase operation) in which a hybrid H and two PIN diodes 1 and 2 are combined, and when the impedance of the 2 PIN diodes 1 and 2 is equal to (matches) the characteristic impedance of the circuit, the signals input from the terminal ① are all absorbed by the PIN diodes 1 and 2 of the terminals ③ and ④, and are not manifested at the terminal ②. Additionally, when the impedances of the two PIN diodes 1 and 2 are equal and are larger/smaller than the characteristic impedance, a signal having an amplitude corresponding to the reflection coefficient of the circuit is manifested in the terminal ②, and the phase thereof is reversed in accordance with whether the impedance of the PIN diode is larger or smaller than the characteristic impedance. When the reflection coefficients of the PIN diodes are equal, the reflected signal is not manifested at the terminal ①.

Thus, according to the signal cancellation method of the present invention (2), as shown in FIG. 6, for example, an input signal is split into a first and second signal A and B, said second signal B is split into first and second subsignals B0 and B0' of the same phase, which are orthogonally recombined after the respective amplitudes thereof have been adjusted, and said first signal A (A') is cancelled by the third signal B' thereby obtained.

By means of the method whereby the second signal B is split into in-phase first and second subsignals B0 and B0', and after the adjustment of the respective amplitudes, these subsignals are orthogonally combined, since there is practically no correlation between the respective amplitude adjustments of the first and second subsignals B0 and B0', these can be adjusted mutually independently, and the composite signal B (B') of their output can be controlled to a desired phase and amplitude over the first through fourth quadrants on the vector plane.

As shown in FIG. 7 or FIG. 8, for example, the first and/or second subsignals B0 (B90) are split into third and fourth subsignals B0, B180 (B90, B270) of mutually opposite phases, the fourth subsignal B180 (B270) is delayed, and after the amplitude of said third subsignal B0 (B90) has been adjusted, it is recombined with the fourth subsignal B180 (B270) after the delay.

In accordance with the present invention, even if the amplitude of the third subsignal B0 (B90) can be changed in forward phase only, the output signal after recombination with the fourth subsignal B180 (B270) can be changed in forward phase and reverse phase.

Further, in the present invention, the first and/or second subsignals are split into third and fourth subsignals of the same phase, the fourth subsignal is delayed, and after the amplitude of the third subsignal has been adjusted, it is recombined in antiphase with the fourth subsignal after the delay.

As described above and shown in FIG. 9 and FIG. 10, the second signal B is split into mutually orthogonal first and second subsignals B0 and B90 and a third subsignal (e.g, B225) having a freely selected phase in the opposite quadrant as the first and second subsignals, the third subsignal B225 is delayed, and after the amplitudes of the first and second subsignals B0, B90 have been adjusted, they are recombined in antiphase with the third subsignal B225 after the aforesaid delay.

In accordance with the present invention, it is possible to make the third subsignal B225 operate on the first and second subsignals B0 and B90 by division into the subsignals B180 and B270 composed of the orthogonal components thereof, can be obtained by a small number of divisions of the second signal B.

In the present invention, the second signal B is split into mutually in-phase first, second, and third subsignals B0, B0', and B0", the third subsignal B0" is delayed, said first and second subsignals B0 and B0' after amplitude adjustment are combined in mutually orthogonal phase and said third subsignal B0" after said delay is combined in a freely selected phase in the quadrant opposite the first and second subsignals B0 and B0'.

In the present invention as described above, a first adjustment process, whereby the amplitude of the first subsignal B0 is adjusted and the amplitude of the output signal at this time is minimized or reduced, and a second adjustment process B90, whereby the amplitude of the second subsignal is adjusted and the amplitude of the output signal at this time is minimized or reduced, are alternately performed in repetition.

In accordance with the present invention, processing may be started from either the first or second adjustment process, and accordingly, unstable operation due to the control start timing is eliminated. Moreover, since there is no correlation between the first and second adjustment processes, control can be focused uniformly and quickly.

The signal cancellation device according to the present invention, as shown in FIG. 2, adjusts the phase and amplitude components of one signal formed by the splitting of an input signal so as to be the antiphase of the other signal, and cancels the input signal component by recombining these signals, and comprises an orthogonal splitter 21, which splits one of said signals B into first and second subsignals B0 and B90 which are mutually orthogonal; first and second amplitude adjusters 22 and 23, which are able to adjust the amplitudes of the first and second subsignals B0 and B90; and an in-phase combiner 24, which combines in-phase said first and second subsignals B0 and B90 which have undergone amplitude adjustment.

The signal cancellation device according to the present invention, as shown in FIG. 6, adjusts the phase and amplitude components of one signal formed by the splitting of an input signal so as to be the antiphase of the other signal, and cancels the input signal component by recombining these signals, and comprises an in-phase splitter 25, which splits one of said signals B into first and second subsignals B0 and B0' having the same phase; first and second amplitude adjusters 22 and 23, which are able to adjust the amplitudes of the first and second subsignals B0 and B0'; and an orthogonal combiner 26, which orthogonally combines said first and second subsignals B0 and B0' which have undergone amplitude adjustment.

In the signal cancellation device according to the present invention, as shown in FIG. 2 and FIG. 6, for example, the first and/or second amplitude adjuster is able to reverse its output signal in positive phase or reverse phase.

In the signal cancellation device according to the present invention, as shown in FIG. 7, the first and/or second amplitude adjuster 22 (23) are/is provided with an anti-phase splitter 31, which splits input subsignals B0 (B90) into third and fourth subsignals B0, B180, (B90, B270) of opposite phases; a delay unit 34 (36), which delays said fourth subsignal B180 (B270), an amplitude adjuster 33 (35), which is able to adjust the amplitude of said third subsignal B0 (B90) in a single phase, and an in-phase combiner 32, which combines in the same phase said third subsignal B0 (B90) after amplitude adjustment and said fourth subsignal B180 (B270) after delay.

In the signal cancellation device according to the present invention, as shown in FIG. 7, the orthogonal splitter 31, which splits the split signal B into mutually orthogonal first and second subsignals B0 and B90, and the anti-phase splitter 31, which splits input subsignals B0 and B90 into third and fourth subsignals B0, B180 (B90, B270) having mutually opposite phases, are formed by a common multi-phase splitter 31.

Figure 19:
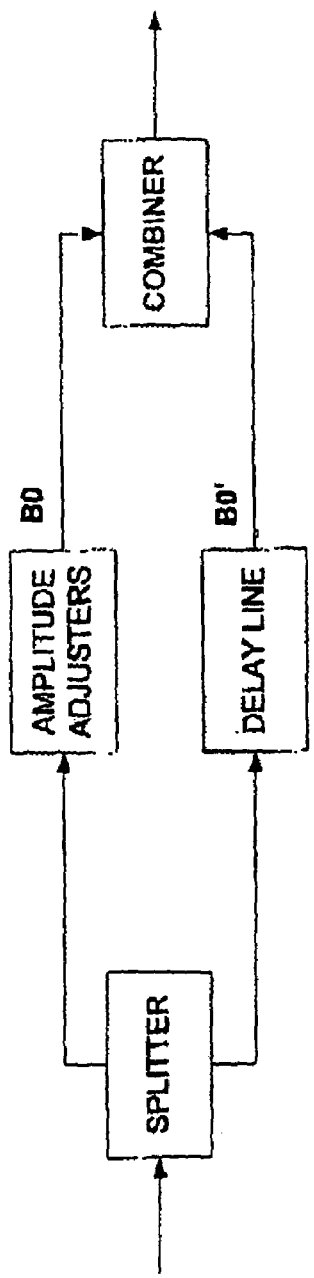
FIG. 19 is a block diagram of the amplitude adjuster of the present invention.

In the signal cancellation device according to the present invention, as shown in FIG. 19, the first and/or second amplitude adjuster 22 (23) are/is provided with an in-phase splitter, which splits input subsignals B0 (B90) into third and fourth subsignals B0, B0' (B90, B90) of the same phase; a delay device, which delays the fourth subsignal B0' (B90'), an amplitude adjuster, which is able to adjust the amplitude of the third subsignal B0 (B90) in a single phase, and an anti-phase combiner, which combines in opposite phases the third subsignal B0 (B90) after amplitude adjustment and the fourth subsignal B0' (B90') after delay.

In the signal cancellation device according to the present invention, the orthogonal combiner, which orthogonally combines the first and second subsignals B0 (B90) after amplitude adjustment, and the anti-phase combiner, which combines said third subsignal B0 (B90) after amplitude adjustment and the fourth subsignal B0' (B90') after delay in opposite phases, are formed by a common multi-phase combiner.

In the signal cancellation device according to the present invention, as shown FIG. 9, the first and/or second amplitude adjuster 22 (23) are/is provided with a splitter 41, which splits the input split signals into mutually orthogonal first and second subsignals B0 and B90 and a third subsignal (e.g., B225), which has a freely selected phase and is in the opposite quadrant of the first and second subsignals; a delay unit 44, which delays the third subsignal B225; third and fourth amplitude adjusters 43 and 45, which are able to adjust the amplitudes of the first and second subsignals B0, B90 each in a single phase; and an in-phase combiner 42, which combines in the same phase the first and second subsignals B0, B90 after amplitude adjustment and the third subsignal B225 after delay.

Figure 20:
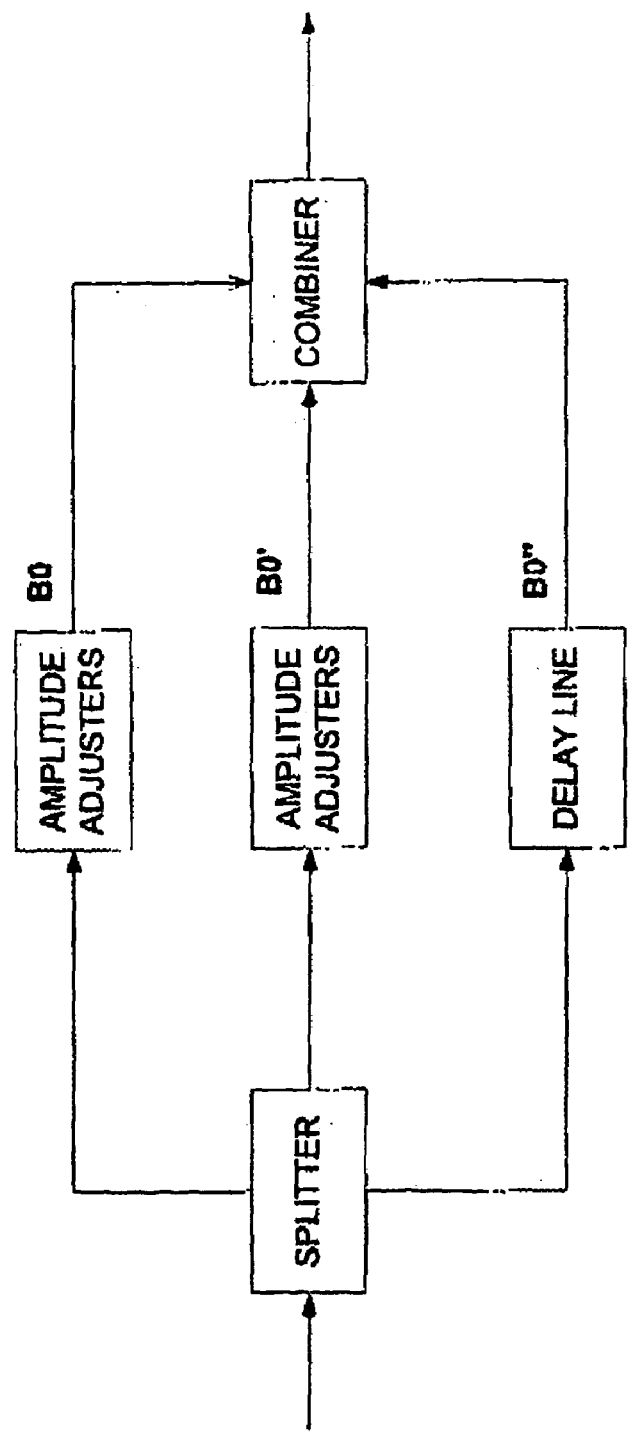
FIG. 20 is a block diagram of another implementation of the amplitude adjuster of the present invention.

In the signal cancellation device according to the present invention, as shown in FIG. 20, the first and/or second amplitude adjusters 22 (23) are/is provided with a splitter, which splits the input split signals into first, second, and third subsignals B0, B0', and B0" having the same phase; a delay device, which delays the third subsignal B0"; third and fourth amplitude adjusters, which are able to adjust the amplitudes of the first and second subsignals B0, B0' each in a single phase; and a combiner, which combines the first and second subsignals B0, B0' in the same phase after amplitude adjustment and said third subsignal B0" after delay in a freely selected phase in the opposite quadrant as said first and second subsignals B0, B0'.

In the signal cancellation device according to the present invention, as shown in FIG. 2 or FIG. 6, an automatic controller 50 is provided, which alternately and repetitively performs a first adjustment process, whereby the amplitude of the output signal at this time is minimized or reduced by controlling the first amplitude adjustment device 22, and a second adjustment process, whereby the amplitude of the output signal at this time is minimized or reduced by controlling the second amplitude adjustment device 23, are alternately performed in repetition.

The feed-forward amplifier of the present invention, as shown in FIG. 11, for example, is provided with a signal cancellation device according to the present invention in a pre-stage distortion extraction loop 10a or a post-stage distortion cancellation loop 10b.

Several desirable embodiments of the present invention have been described above, but various changes in the constitution of parts, control, and combinations thereof needless to say, may be made within a range that does not exceed the concepts of the present invention.

What is claimed is:

1. A signal cancellation method comprising the steps of:
splitting an input signal into a first and a second signal;
splitting said second signal into mutually orthogonal first and second subsignals;
recombining said first and second subsignals after respective amplitudes thereof have been adjusted, forming a third signal; and
canceling said first signal by the third signal thereby obtained,
wherein said second signal is split into mutually orthogonal first and second subsignals and a third subsignal having a freely selected phase in the opposite quadrant as said first and second subsignals and said third subsignal is delayed, and after the amplitudes of said first and second subsignals have been adjusted, said first and second subsignals are recombined in antiphase with said third subsignal after said delay.

2. A signal cancellation method comprising the steps of:
splitting an input signal into a first and a second signal;
splitting said second signal into mutually orthogonal first and second subsignals;
recombining said first and second subsignals after respective amplitudes thereof have been adjusted, forming a third signal; and
canceling said first signal by the third signal thereby obtained,
wherein a first adjustment process, whereby the amplitude of the first subsignal is adjusted and the amplitude of the output signal at this time is minimized or reduced, and a second adjustment process, whereby the amplitude of the second subsignal is adjusted and the amplitude of the output signal at this time is minimized or reduced, are alternately performed in repetition.

3. A signal cancellation method comprising the steps of:
splitting an input signal into a first and a second signal;
splitting said second signal into first and second subsignals of same phase;
orthogonally recombining said first and second subsignals after respective amplitudes thereof have been adjusted, forming a third signal; and
canceling said first signal by the third signal thereby obtained,
wherein said second subsignals is split into mutually orthogonal first and second subsignals and a third subsignal having a freely selected phase in the opposite quadrant as said first and second subsignals, said third subsignal is delayed and after the amplitudes of said first and second subsignals have been adjusted, said first and second subsignals are recombined in antiphase with said third subsignal after said delay.

4. A signal cancellation method comprising the steps of:
splitting an input signal into a first and a second signal;
splitting said second signal into first and second subsignals of same phase;
orthogonally recombining said first and second subsignals after respective amplitudes thereof have been adjusted, forming a third signal; and
canceling said first signal by the third signal thereby obtained,
wherein said second signals is split into mutually in-phase first, second and third subsignals, said third subsignal is delayed, and first and second subsignals after amplitude adjustment are recombined in mutual orthogonal phase and said third subsignal after said delay is combined in a freely selected phase in the quadrant opposite the first and second subsignals.

5. A signal cancellation method comprising the steps of:
splitting an input signal into a first and a second signal;
splitting said second signal into first and second subsignals of same phase;
orthogonally recombining said first and second subsignals after respective amplitudes thereof have been adjusted, forming a third signal; and
canceling said first signal by the third signal thereby obtained,
wherein a first adjustment process, whereby the amplitude of the first subsignal is adjusted and the amplitude of the output signal at this time is minimized or reduced, and a second adjustment process, whereby the amplitude of the second subsignal is adjusted and the amplitude of the output signal at this time is minimized or reduced, are alternately performed in repetition.

* * * * *